US011749726B2

(12) United States Patent
Bothe et al.

(10) Patent No.: US 11,749,726 B2
(45) Date of Patent: Sep. 5, 2023

(54) FIELD EFFECT TRANSISTOR WITH SOURCE-CONNECTED FIELD PLATE

(71) Applicant: Wolfspeed, Inc., Durham, NC (US)

(72) Inventors: Kyle Bothe, Cary, NC (US); Jeremy Fisher, Raleigh, NC (US); Matt King, Wake Forest, NC (US); Jia Guo, Apex, NC (US); Qianli Mu, San Jose, CA (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 90 days.

(21) Appl. No.: 17/325,666

(22) Filed: May 20, 2021

(65) Prior Publication Data

US 2022/0130965 A1 Apr. 28, 2022

Related U.S. Application Data

(63) Continuation-in-part of application No. 17/081,476, filed on Oct. 27, 2020, now Pat. No. 11,502,178.

(51) Int. Cl.

| | |
|---|---|
| ***H01L 29/40*** | (2006.01) |
| ***H01L 29/66*** | (2006.01) |
| ***H01L 29/20*** | (2006.01) |
| ***H01L 29/778*** | (2006.01) |

(52) U.S. Cl.

CPC ........ *H01L 29/404* (2013.01); *H01L 29/2003* (2013.01); *H01L 29/402* (2013.01); *H01L 29/66462* (2013.01); *H01L 29/778* (2013.01); *H01L 29/7786* (2013.01)

(58) Field of Classification Search

CPC ................ H01L 29/402; H01L 29/404; H01L 29/66462; H01L 29/778; H01L 29/7786; H01L 29/2003

See application file for complete search history.

(56) References Cited

U.S. PATENT DOCUMENTS

| | | | |
|---|---|---|---|
| 6,849,882 | B2 | 2/2005 | Chavarkar et al. |
| 7,126,426 | B2 | 10/2006 | Mishra et al. |
| 7,230,284 | B2 | 6/2007 | Parikh et al. |
| 7,419,892 | B2 | 9/2008 | Sheppard et al. |
| 7,501,669 | B2 | 3/2009 | Parikh et al. |
| 7,550,783 | B2 | 6/2009 | Wu et al. |

(Continued)

FOREIGN PATENT DOCUMENTS

| | | | |
|---|---|---|---|
| CN | 108565283 | A | 9/2018 |
| KR | 20080108486 | A | 12/2008 |

OTHER PUBLICATIONS

International Search Report and Written Opinion of the International Searching Authority, PCT/US2022/030233, dated Sep. 2, 2022, 10 pages.

*Primary Examiner* — Joseph C. Nicely

(74) *Attorney, Agent, or Firm* — Sage Patent Group

(57) ABSTRACT

A transistor device includes a semiconductor layer, source and drain contacts on the semiconductor layer, a gate contact on the semiconductor layer between the source and drain contacts, and a field plate over the semiconductor layer between the gate contact and the drain contact. The transistor device includes a first electrical connection between the field plate and the source contact that is outside an active region of the transistor device, and a second electrical connection between the field plate and the source contact.

33 Claims, 23 Drawing Sheets

142 126A 126 140 140 100 144 130 143 145 B B A A 135 126B d

(56) References Cited

U.S. PATENT DOCUMENTS

| | | | |
|---|---|---|---|
| 7,573,078 | B2 | 8/2009 | Wu et al. |
| 7,875,537 | B2 | 1/2011 | Suvorov et al. |
| 8,823,057 | B2 | 9/2014 | Sheppard et al. |
| 9,318,594 | B2 | 4/2016 | Sheppard et al. |
| 9,711,633 | B2 | 7/2017 | Sheppard et al. |
| 9,847,411 | B2 | 12/2017 | Sriram et al. |
| 9,984,881 | B2 | 5/2018 | Sheppard et al. |
| 10,692,998 | B2 | 6/2020 | Fayed et al. |
| 10,892,356 | B2 | 1/2021 | Sriram et al. |
| 10,971,612 | B2 | 4/2021 | Bothe et al. |
| 2005/0253167 | A1 | 11/2005 | Wu et al. |
| 2006/0202272 | A1 | 9/2006 | Wu et al. |
| 2008/0073670 | A1 | 3/2008 | Yang et al. |
| 2008/0128752 | A1 | 6/2008 | Wu |
| 2009/0230429 | A1 | 9/2009 | Miyamoto et al. |
| 2010/0276698 | A1 | 11/2010 | Moore et al. |
| 2012/0049973 | A1 | 3/2012 | Smith, Jr. et al. |
| 2012/0194276 | A1 | 8/2012 | Fisher |
| 2013/0134482 | A1 | 5/2013 | Yu et al. |
| 2013/0193485 | A1 | 8/2013 | Akiyama et al. |
| 2013/0228789 | A1 | 9/2013 | Yamamura |
| 2014/0001478 | A1 | 1/2014 | Saunier et al. |
| 2014/0361342 | A1 | 12/2014 | Sriram et al. |
| 2020/0027956 | A1 | 1/2020 | Aoki |
| 2020/0312968 | A1* | 10/2020 | Kasahara ............ H01L 29/1608 |
| 2021/0013314 | A1 | 1/2021 | Hu et al. |
| 2022/0130985 | A1 | 4/2022 | Bothe et al. |
| 2022/0302271 | A1 | 9/2022 | Trang et al. |
| 2022/0367106 | A1 | 11/2022 | Lee et al. |
| 2022/0376085 | A1 | 11/2022 | Bothe et al. |
| 2022/0376098 | A1 | 11/2022 | Lee et al. |
| 2022/0376099 | A1 | 11/2022 | Bothe et al. |
| 2022/0376104 | A1 | 11/2022 | Bisges et al. |
| 2022/0376105 | A1 | 11/2022 | Guo et al. |

* cited by examiner

FIELD EFFECT TRANSISTOR WITH SOURCE-CONNECTED FIELD PLATE

CROSS REFERENCE TO RELATED APPLICATION

The present application is a continuation-in-part of U.S. application Ser. No. 17/081,476, entitled "FIELD EFFECT TRANSISTOR WITH AT LEAST PARTIALLY RECESSED FIELD PLATE," filed Oct. 27, 2020, the disclosure of which is incorporated herein by reference in its entirety.

BACKGROUND

The present disclosure relates to transistor structures and in particular to field effect transistors including field plates.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H—SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/$cm^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

Field plates have been used to enhance the performance of GaN-based HEMTs at microwave frequencies and have exhibited performance improvement over devices without field plates. Many field plate approaches have involved a field plate connected to the source of the transistor with the field plate on top of the drain side of a channel. This can result in a reduction of the electric field on the gate-to-drain side of the transistor, thereby increasing breakdown voltage and reducing the high-field trapping effect. However, some transistors with gate-to-drain field plates can exhibit relatively poor reliability performance, particularly at class C (or higher class) operation where the electric field on the source side of the gate becomes significant.

FIG. 1 is a plan view of some portions of the metallization of a field effect transistor device 10, which may, for example, be a GaN-based HEMT device. FIG. 2A is a cross-section of a portion of the transistor device 10 taken along line A-A of FIG. 1, and FIG. 2B is a cross-section of a portion of the transistor device 10 taken along line B-B of FIG. 1.

Referring to FIG. 1, metal portions of a transistor device 10 include a source overmetallization 42, and a drain overmetallization 44. A gate (or gate) 26 is between the source overmetallization 42 and the drain overmetallization 44. A field plate 40 is between the gate 26 and the drain overmetallization 44. The field plate 40 partially overlaps the gate 26. The field plate 40 is connected to the source contact 22 by a plurality of metal straps 25 that cross over the gate 26 to contact the source overmetallization 42.

Referring to FIGS. 1, 2A and 2B, a GaN channel layer 16 is formed on a silicon carbide substrate 12, and an AlGaN barrier layer 18 is on the channel layer 16. A two-dimensional electron gas (2DEG) 20 arises in the channel layer 16 adjacent the barrier layer 18. A source contact 22 and a drain contact 24 are formed on the channel layer 16. The conductivity of the 2DEG 20 is modulated by applying a voltage to a gate 26 that is formed on the barrier layer 18 between the source contact 22 and the drain contact 24. As shown in FIGS. 2A and 2B, the gate 26 may have a mushroom or T-top configuration in which the gate 26 contacts the barrier layer 18 in a relative narrow contact region that extends through a surface dielectric layer 25.

The transistor device 10 includes a field plate 40 that is connected to the source contact 22. The field plate 40 is spaced apart from the gate 26 by an interlayer dielectric layer 21, and is spaced apart from the barrier layer 18 by the interlayer dielectric layer 21 and the surface dielectric layer 25. The field plate 40 extends above the gate 26 and laterally toward the drain 24.

As noted above, the field plate 40 is connected to the source contact 22 by a plurality of straps 35 that cross over the gate 26 to contact a source overmetallization 42 that contacts the source contact 22. Connecting the field plate 40 to the source contact 22 may provide a reduction in gate-to-drain capacitance (Cgd), which consequently can enhance the gain of the device. In addition to reducing gate-to-drain capacitance Cgd, the presence of the field plate 40 may improve linearity of the device and/or reduce the drain bias dependence of the capacitance. However, the use of multiple straps 35 to connect the field plate 40 to the source overmetallization 42 may undesirably increase the gate-to-drain capacitance Cgd and/or the drain-to-source capacitance Cds of the device.

SUMMARY

A transistor device includes a semiconductor layer, source and drain contacts on the semiconductor layer, a gate contact on the semiconductor layer between the source and drain contacts, and a field plate over the semiconductor layer between the gate contact and the drain contact. The transistor device includes a first electrical connection between the field plate and the source contact that is outside an active region of the transistor device, and a second electrical connection between the field plate and the source contact.

The first electrical connection between the field plate and the source contact does not cross over the gate contact.

The transistor device may include a source metallization in electrical contact with the source contact, and the first electrical connection may include a field plate extension that extends outside the active region of the device in a loop to contact the source metallization.

In some embodiments, the transistor device includes a source metallization in electrical contact with the source contact, and the second electrical connection includes a strap that extends from the field plate over the gate to the source metallization.

In some embodiments, the second electrical connection may be located between 0 and 500 microns from an end of the gate opposite the first electrical connection. The second electrical connection may be located between 10 and 50 microns from the end of the gate opposite the first electrical connection, and in some embodiments, the second electrical connection may be located about 20 microns from the end of the gate opposite the first electrical connection.

The second electrical connection may be formed outside the active region of the device and may not cross over the gate.

In some embodiments, the transistor device may include a source metallization in electrical contact with the source contact, and the second connection may include a field plate extension that extends outside the active region of the device in a loop to contact the source metallization. The first electrical connection and the second electrical connection may be formed as part of a source metallization process.

In some embodiments, the second electrical connection between the field plate and the source contact includes a plurality of strap that extend from the field plate over the gate to the source metallization within the active region of the transistor device.

In some embodiments, the field plate includes a first field plate, and the transistor device further includes a second field plate over the semiconductor layer between the gate contact and the drain contact, a third electrical connection between the second field plate and the source contact, wherein the third electrical connection is outside an active region of the transistor device, and a fourth electrical connection between the second field plate and the source contact.

In some embodiments, the third electrical connection between the second field plate and the source contact does not cross over the gate contact. For example, the transistor device may include a source metallization in electrical contact with the source contact, and the third electrical connection may include a field plate extension that extends outside the active region of the device in a loop to contact the source metallization.

In some embodiments, the transistor device includes a source metallization in electrical contact with the source contact, and the fourth electrical connection includes a strap that extends from the second field plate over the gate to the source metallization.

A method of forming a transistor device according to some embodiments includes providing a semiconductor layer, forming source and drain contacts on the semiconductor layer, forming a gate contact on the semiconductor layer between the source and drain contacts, forming a field plate over the semiconductor layer between the gate contact and the drain contact, forming a first electrical connection between the field plate and the source contact, wherein the first electrical connection is outside an active region of the transistor device, and forming a second electrical connection between the field plate and the source contact.

A transistor device according to some embodiments includes a semiconductor layer, source and drain contacts on the semiconductor layer, a gate contact on the semiconductor layer between the source and drain contacts, and a field plate over the semiconductor layer between the gate contact and the drain contact. The transistor device includes a first electrical connection between the field plate and the source contact that is outside an active region of the transistor device, and a second electrical connection between the field plate and the source contact that is within the active region of the device.

DETAILED DESCRIPTION OF EMBODIMENTS

Figure 1:
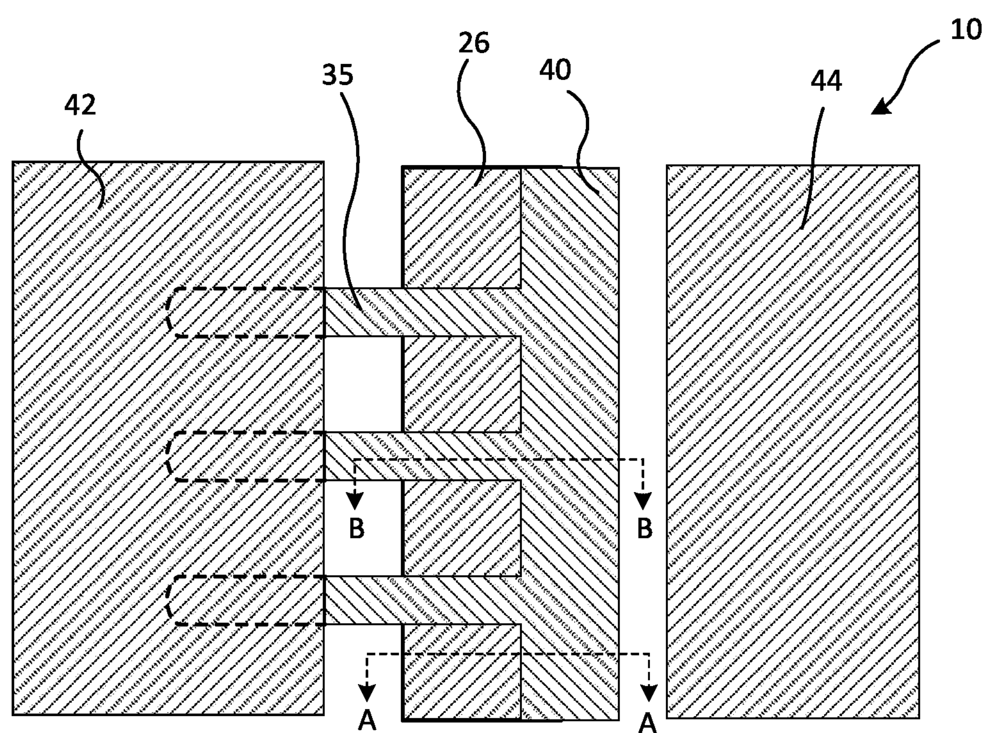
FIG. 1 is a schematic plan view of a metallization pattern of a conventional high electron mobility transistor device.
Figure 2A:
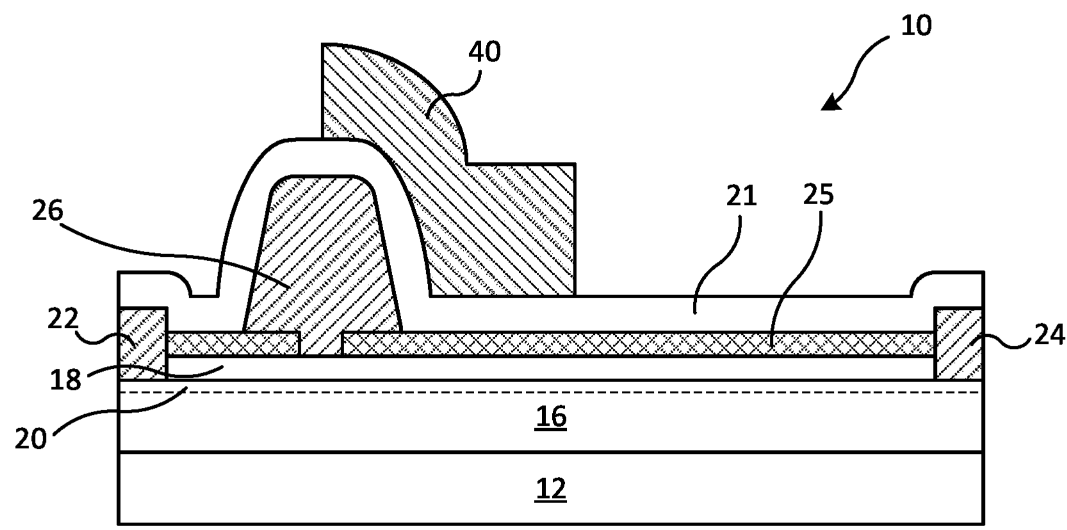
FIGS. 2A and 2B are schematic cross-sectional views of a the transistor device shown in FIG. 1.
Figure 2B:
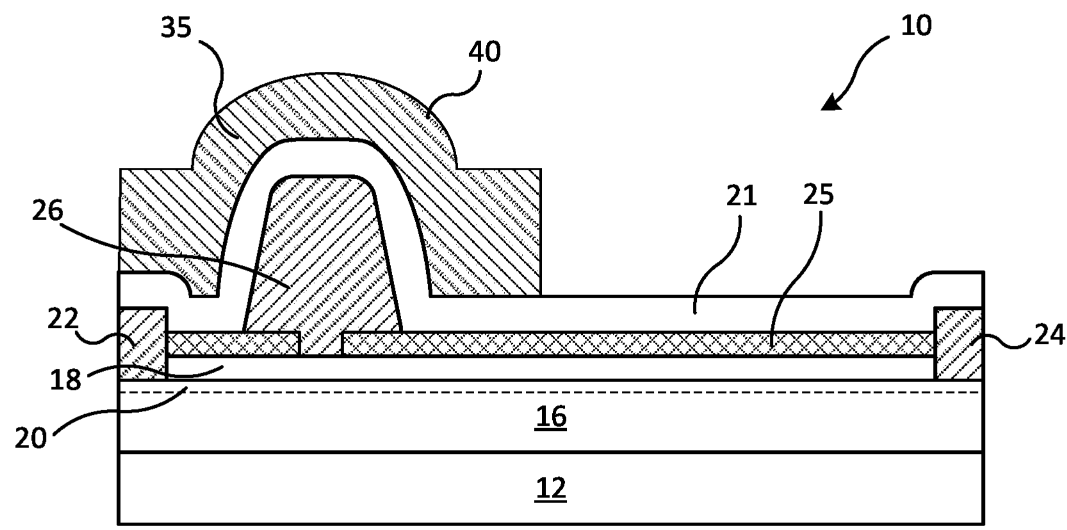

Embodiments of the inventive concepts will now be described in connection with the accompanying drawings. Some embodiments described herein provide a transistor device including a field plate that is self-aligned the gate, and in some embodiments that is laterally spaced apart from the gate, such that the field plate does not overlap the gate in the vertical direction. In some embodiments, the field plate is recessed toward the barrier layer in a recess region. In still further embodiments, the field plate may be connected to the source outside an active area of the device by means of a connection that does not cross over the gate of the device.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the disclosure herein is for the purpose of describing particular embodiments only and is not intended to be limiting of the disclosure. As used in the description of the disclosure and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the disclosure unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

As described above in connection with FIG. 1, in a conventional transistor device including a source-connected field plate, the field plate may be connected to the source contact by means of a plurality of straps that cross over the gate of the device. Although connecting the field plate to the source contact may provide a reduction in gate-to-drain capacitance (Cgd), the use of multiple straps 25 to connect the field plate 40 to the source may undesirably increase the gate-to-drain capacitance Cgd and/or the drain-to-source capacitance Cds of the device. In addition, the presence of multiple straps may reduce the knee frequency of the device.

Some embodiments provide a field effect transistor device including a source-connected field plate in which at least one connection between the field plate and the source contact is made outside the active region of the device, which may further reduce the gate-to-drain capacitance Cgd and/or the drain-to-source capacitance Cds of the device. That is, the field plate 140 may be connected to the source contact 122 by at least one connection outside the active area of the device such that the connection does not cross over the gate metal.

Figure 3A:
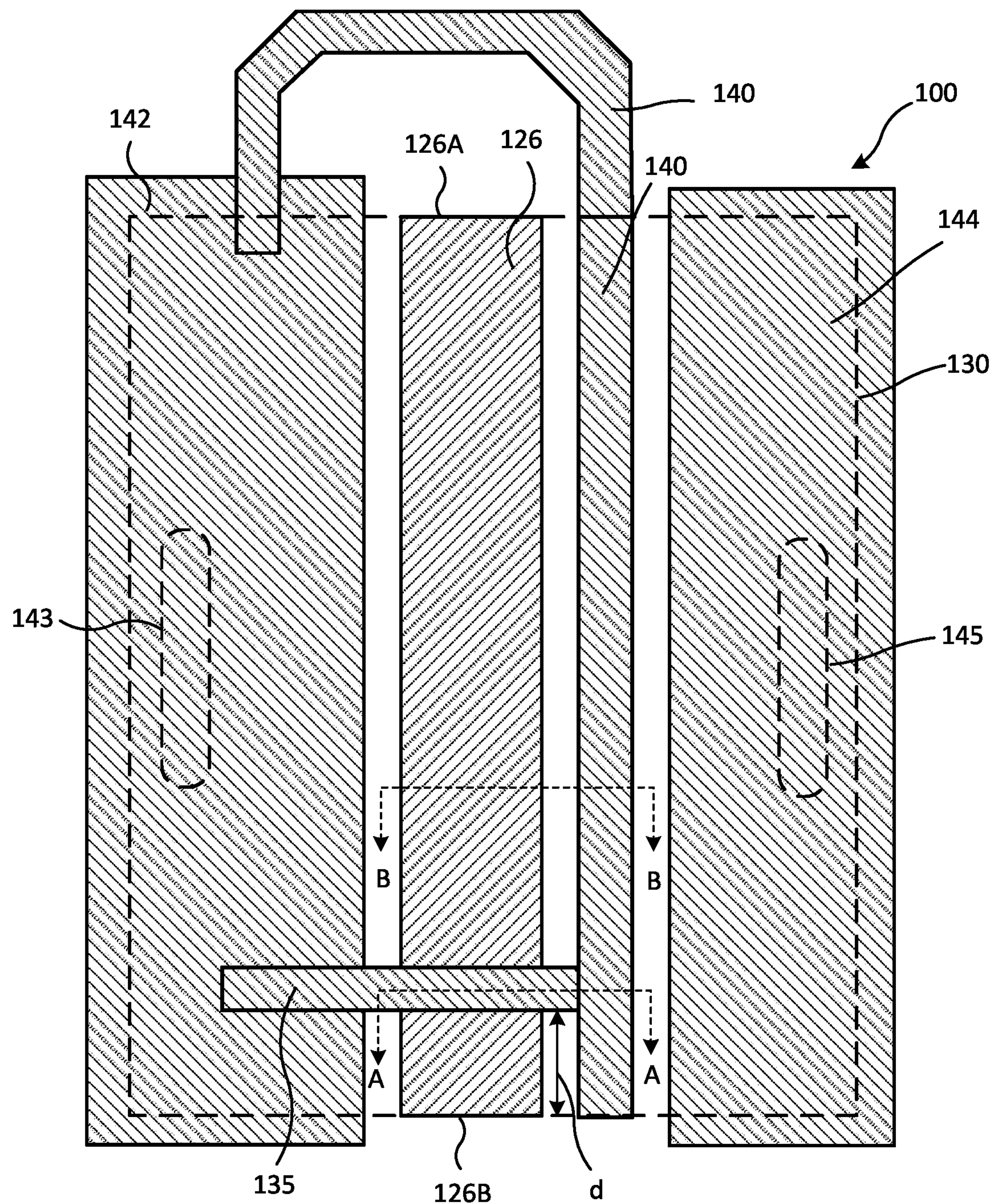
FIGS. 3A, 3B and 3C are schematic plan views of a metallization patterns of a transistor device according to some embodiments.

For example, FIG. 3A is a plan view of a portion of a metallization pattern for a field effect transistor device 100 according to some embodiments. The metallization pattern includes a source overmetallization 142, a drain overmetallization 144, a gate 126 and a field plate 140. An active region 130 of the transistor device 100 is defined by the position of the source 122, gate 126 and drain 124 contacts illustrated in FIG. 4A. The source overmetallization 142 is connected to the source contact 122 by a conductive via 143, and the drain overmetallization 144 is connected to the drain contact 124 by a conductive via 145. The source and drain contacts 122, 124, may include a metal, such as TiAlN, that can form an ohmic contact to Group III nitride-based materials. The source and drain overmetallizations may be formed using a metal or other highly conductive material, including, for example, copper, cobalt, gold, and/or a composite metal. The gate 126 may include a metal capable of making a Schottky contact to a nitride based semiconductor material, such as Ni, Pt, NiSix, Cu, Pd, Cr, TaN, W, and/or WSiN.

The gate 126 may be referred to as a "gate finger." The "active region" of the device generally refers to the area of the device where an electrical channel between the source and drain regions is formed and where electrical conduction occurs through the channel layer 116 during ON-state operation of the device.

As shown in FIG. 3A, a first connection between a field plate 140 and a source overmetallization 142 is made outside the active region 130 of the device. In particular, in some embodiments, a conductive field plate extension 140 extends from the field plate 140 outside the active region 130 in a loop around a first end 126A of gate 126 metallization (rather than crossing over the gate 126) to contact the source overmetallization 142 without crossing over the gate 126.

A second connection is made between the field plate 140 and the source overmetallization 142 by means of a conductive strap 135 that crosses over the gate 126 near a second end 126B of the gate 126. The strap 135 may be positioned between about 0 microns and 500 microns from the end 126B of the gate 126 opposite the first connection.

In some embodiments, the strap 135 may be positioned between about 10 microns and 50 microns from the end 126B of the gate 126, and in particular embodiments the strap 135 may be positioned about 20 microns from the end 126B of the gate 126.

The strap 135 may be formed as part of the same metallization as the field plate 140.

The strap 135 connection may help to reduce the source-field plate inductance ($L_{S\text{-}FP}$) of the device, which may be undesirably high if only a single loop connection is made between the field plate 140 and the source metallization 142 outside the active region 130.

This arrangement may reduce the gate-to-drain capacitance Cgd and/or the drain-to-source capacitance Cds of the device while maintaining a low source-field plate inductance. This may improve the switching frequency response of the device, as well as FET stability and the power-knee frequency trade-off. The arrangement shown in FIG. 3A with a single strap in the active region and loop connection outside the active region may be used for gate lengths ranging from 50 microns to 500 microns. For gate lengths larger than 500 microns, an additional active region strap may be needed for each additional 500 microns of gate length to maintain low source-field plate inductance.

In some embodiments, the transistor device 100 may include multiple conductive strap connections between the field plate 140 and the source overmetallization. For example, FIG. 3B is a plan view of a portion of a metallization pattern for a field effect transistor device 100' according to some embodiments in which the transistor device 100' includes a first conductive strap connection 135-1 between the field plate 140 and the source overmetallization 142 and a second conductive strap connection 135-2 between the field plate 140 and the source overmetallization 142.

Figure 3B:
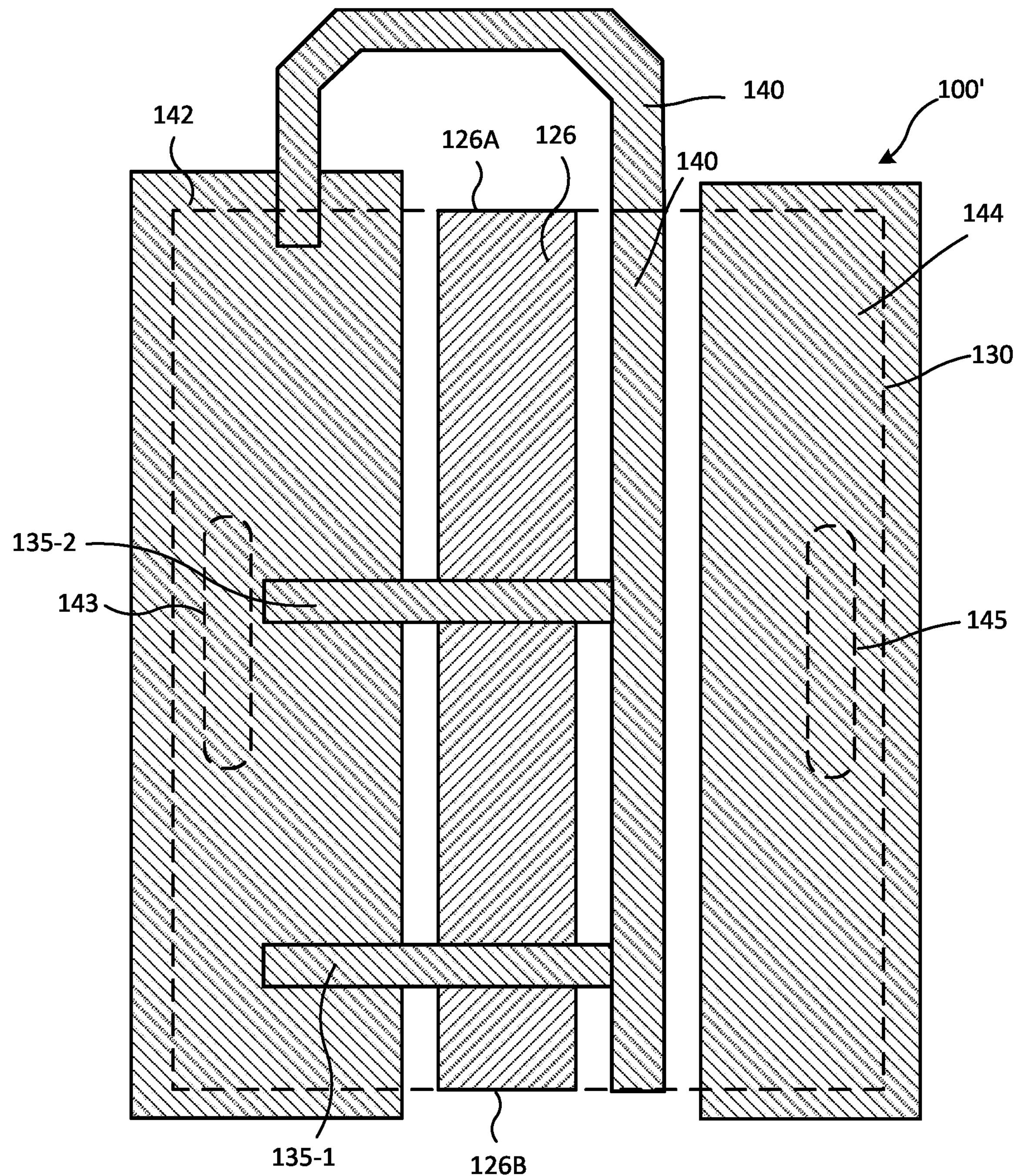
Figure 3C:
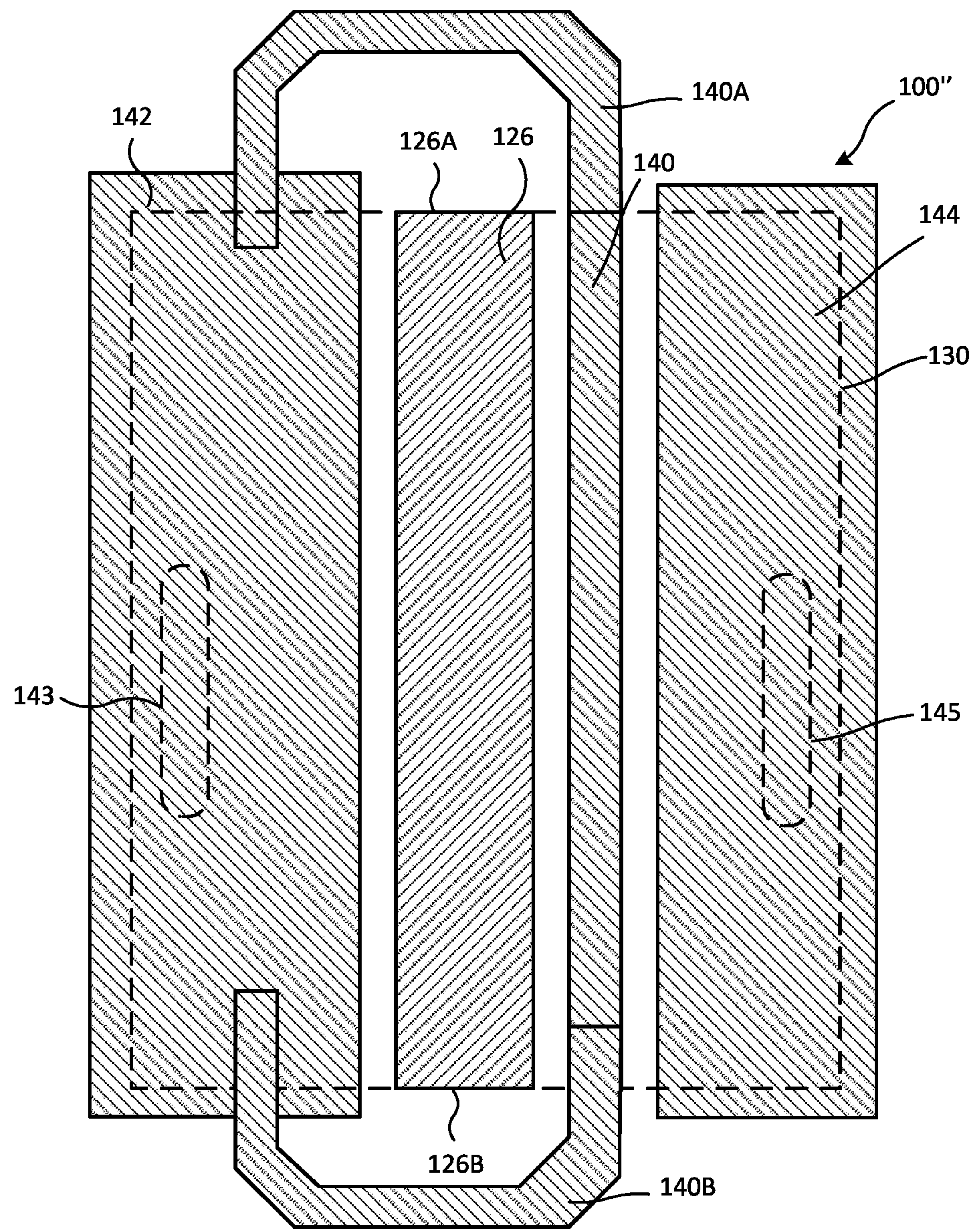

FIG. 3C illustrates a metallization pattern for the transistor device 100" according to further embodiments in which the field plate 140 is connected to the source overmetallization 142 by means of loop connections extending around opposite ends of the gate 126. In particular, the metallization pattern includes a first field plate extension 140A that extends from a first end of the field plate 140 in a first loop around a first end 126A of the gate 126 metallization to contact the source overmetallization 142 without crossing over the gate 126, and a second field plate extension 140B that extends from a second end of the field plate 140 in a second loop around a second end 126B of the gate 126 metallization to contact the source overmetallization 142 without crossing over the gate 126. Accordingly, the embodiments illustrated in FIG. 3C include no conductive strap connections between the field plate 140 and the source overmetallization 142 within the active region of the device.

The embodiment illustrated in FIG. 3C may use somewhat more chip area for a given gate length, but avoids having any strap connection that crosses over the gate 126.

Although the gate 126 and the field plate 140 are illustrated in FIGS. 3A to 3C as being laterally spaced apart, it will be appreciated that in some embodiments, the field plate 140 may overlap the gate 126 in the lateral direction, in which case the field plate 140 and the gate 126 may be separated by a dielectric layer in the area of overlap.

Figure 4A:
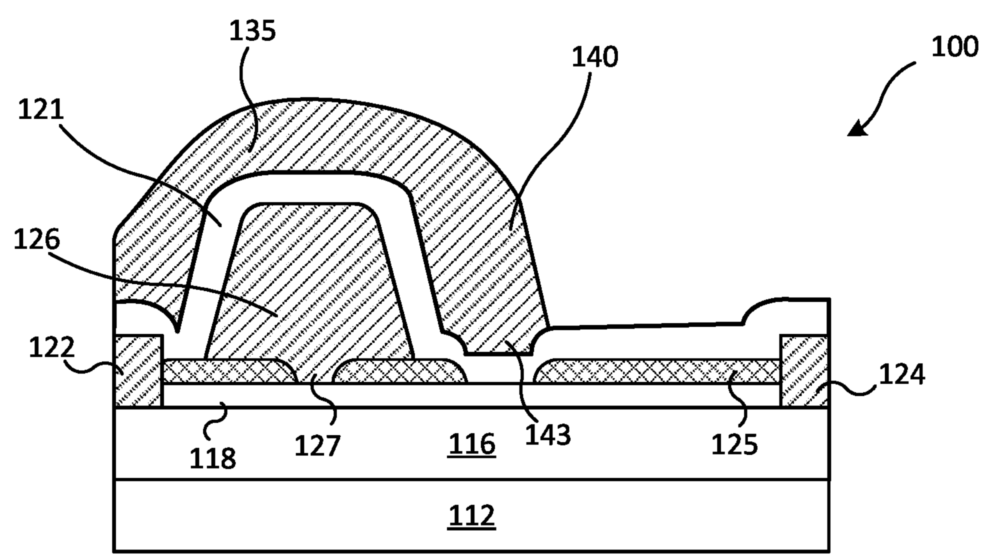
FIGS. 4A and 4B are schematic cross-sectional views of the transistor device of FIG. 3A.
Figure 4B:
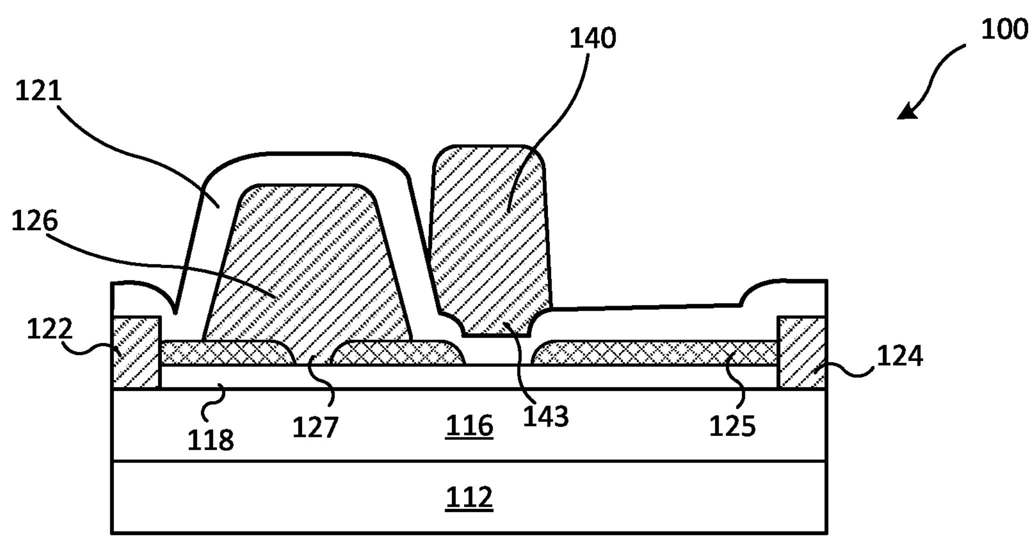

FIGS. 4A and 4B are schematic cross-sectional views of portions of the transistor device 100 shown in FIG. 3A, taken along section lines A-A and B-B, respectively.

Referring to FIGS. 4A and 4B, a transistor device according to some embodiments is illustrated. In particular, FIGS. 4A and 4B illustrate a high electron mobility transistor 100 formed on a substrate 112. A channel layer 116 is formed on the substrate 112, and a barrier layer 118 is on the channel layer 116.

A source contact 122 and a drain contact 124 are formed on the channel layer 116. A gate 126 is formed on the barrier layer 118 between the source contact 122 and drain contact 124. As shown in FIGS. 4A and 4B, the gate 26 may have a mushroom or T-top configuration in which the gate 126 contacts the barrier layer 118 in a relative narrow contact region of a recessed contact portion 127 of the gate 126 that extends through a surface dielectric layer 125 within a gate aperture 162 that extends through the surface dielectric layer 125.

The surface dielectric layer 125 also includes a field plate aperture 164 that extends through the surface dielectric layer 125 to expose the barrier layer 118.

In some embodiments, the substrate 112 includes silicon carbide, the channel layer 116 includes GaN, and the barrier layer includes AlGaN. However, it will be appreciated that other materials or combinations of materials can be used. Moreover, the channel layer 116 and/or the barrier layer 118 may include an alloy such as $Al_xGa_{1-x}N$, where $0 \le x \le 1$. It will be further appreciated that although a HEMT device is illustrated, the device 100 may be another type of transistor device, such as a metal-semiconductor field effect transistor (MESFET), a junction field effect transistor (JFET), a metal oxide semiconductor field effect transistor (MOSFET), etc.

The device 100 includes a field plate 140 that is connected to the source contact 122 via a connection outside the active region of the device as described above in connection with FIG. 3. As described above, in some embodiments, at least one connection between the field plate 140 and the source contact 122 does not cross over the gate 126.

The field plate 140 is spaced apart laterally from the gate 126 by an interlayer dielectric layer 121, and does not extend up and over the gate 126 as in the structure shown in FIG. 1, which may suffer from poor step coverage, leading to cracks in the field plate metallization. The field plate 140 is electrically connected to the source contact 122 outside the active region of the device (and outside the plane illustrated in FIGS. 4A and 4B).

Like the gate 126, the field plate 140 may have a mushroom or T-top configuration that is partially recessed with a central recessed portion 143 and one or more wing portions extending laterally from the recessed portion 143. In some embodiments, the field plate 140 includes a source-side wing 146 extending laterally toward the source contact 122 and a drain-side wing 148 extending laterally toward the drain contact 124.

The field plate 140 is generally vertically spaced apart from the barrier layer 118 by the interlayer dielectric layer 121 and the surface dielectric layer 125. A distance between the wings of the field plate 140 and the barrier layer 118 corresponds to a total thickness of the interlayer dielectric layer 121 and the surface dielectric layer 125. The field plate 140 includes a recessed portion 143 above the field plate aperture 164 that is vertically spaced apart from the barrier layer 118, within a region above the field plate aperture 164, by a distance dl that is equal to only the thickness of the interlayer dielectric layer 121.

A passivation layer 132 is formed over the interlayer dielectric layer 121 and the field plate 140, and a field dielectric layer 134 is formed over the passivation layer 132. The passivation layer 132 may fill a gap between the field plate 140 and the gate 126 that is not filled by the interlayer dielectric layer 121.

The surface dielectric layer 125, the interlayer dielectric layer 121, the passivation layer 132 and the field dielectric layer 134 may include one or more layers of silicon nitride, silicon oxide, silicon oxynitride, aluminum oxide or other atomic layer deposition films, or a multilayer insulator structure, such as an oxide-nitride-oxide layer. In particular embodiments, the surface dielectric layer 125 and the interlayer dielectric layer 121 comprise silicon nitride, the passivation layer 132 comprises silicon oxynitride, and the field dielectric layer 134 comprises silicon nitride.

In some embodiments, the distance between the recessed portion 143 of the field plate 140 and the barrier layer 118 maybe from about 60 nm to about 300 nm, and in some embodiments between about 100 nm and 200 nm. Recessing a portion of the field plate 140 as described herein may decrease the gate-to-drain capacitance, Cgd, which may increase the efficiency, linearity, gain, and/or bandwidth of an amplifier that is made using the device. Moreover, by using an etching process to form a field plate aperture 164 in the surface dielectric layer 125 that defines the location of the recessed portion 143 of the field plate 140, precise control over the positioning of the recessed portion 143 can be obtained, which may improve process repeatability and manufacturability of the device while also obtaining more precise control over the electrical properties of the device.

Separating the field plate 140 from the gate 126 in a lateral direction (e.g., by not overlapping the field plate 140 and the gate 126) may also reduce the gate-to-drain capacitance Cgd and/or drain-to-source capacitance Cds of the device by improving the ability of the field plate 140 to block feedback capacitance from the gate to the drain. That is, overlapping the field plate 140 and the gate 126 may result in additional parasitic capacitance without any added benefit.

Figure 5A:
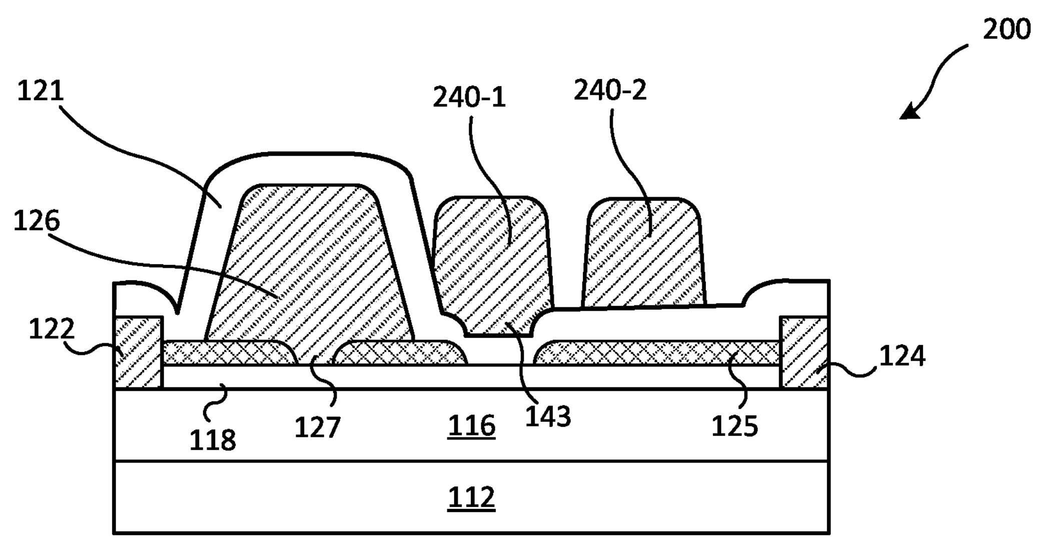
FIG. 5A is a schematic cross-sectional view of a transistor device according to further embodiments.
Figure 5B:
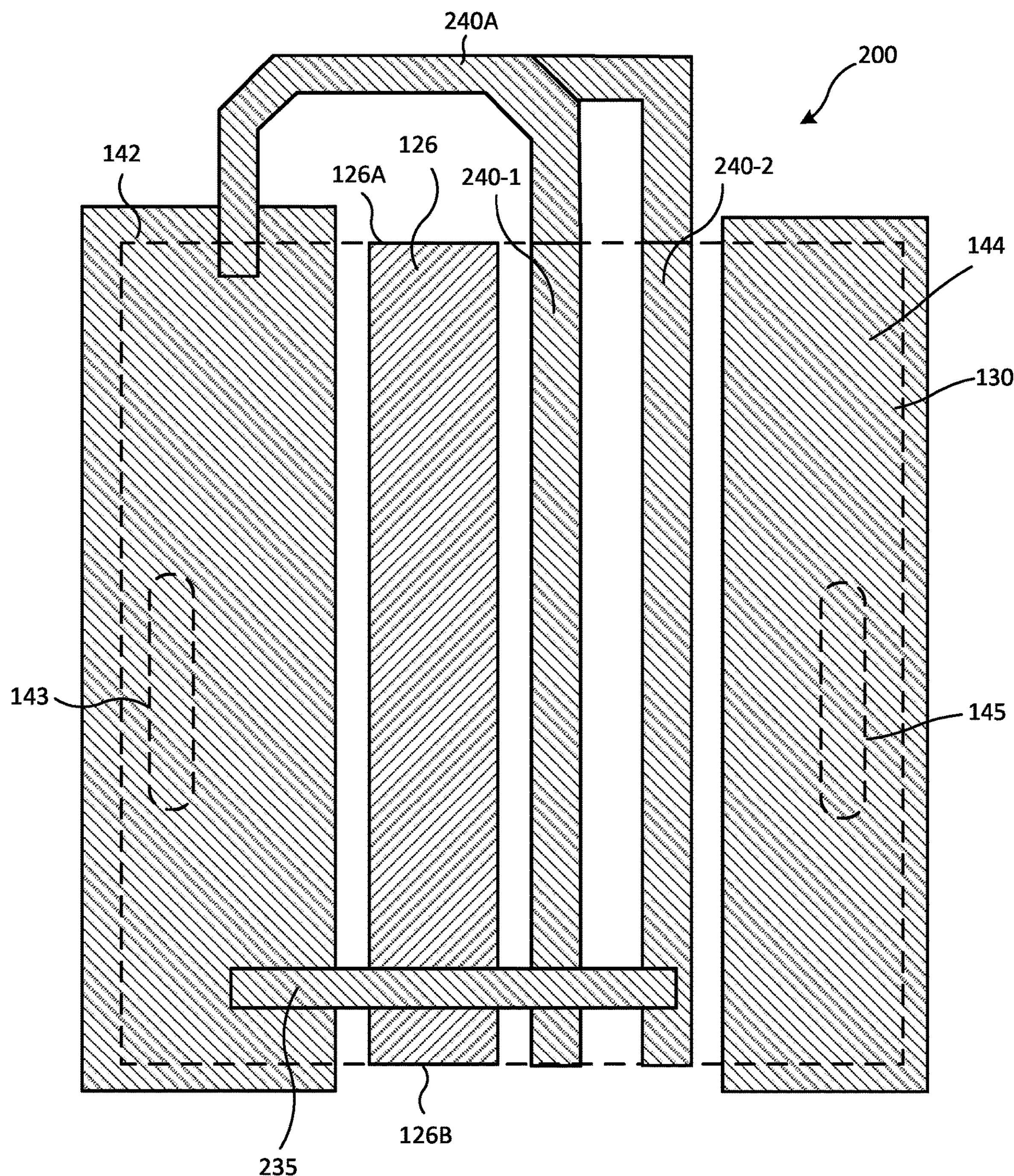
FIGS. 5B, 5C, 5D and 5E are a schematic plan views of the transistor device of FIG. 5A according to various embodiments.
Figure 5C:
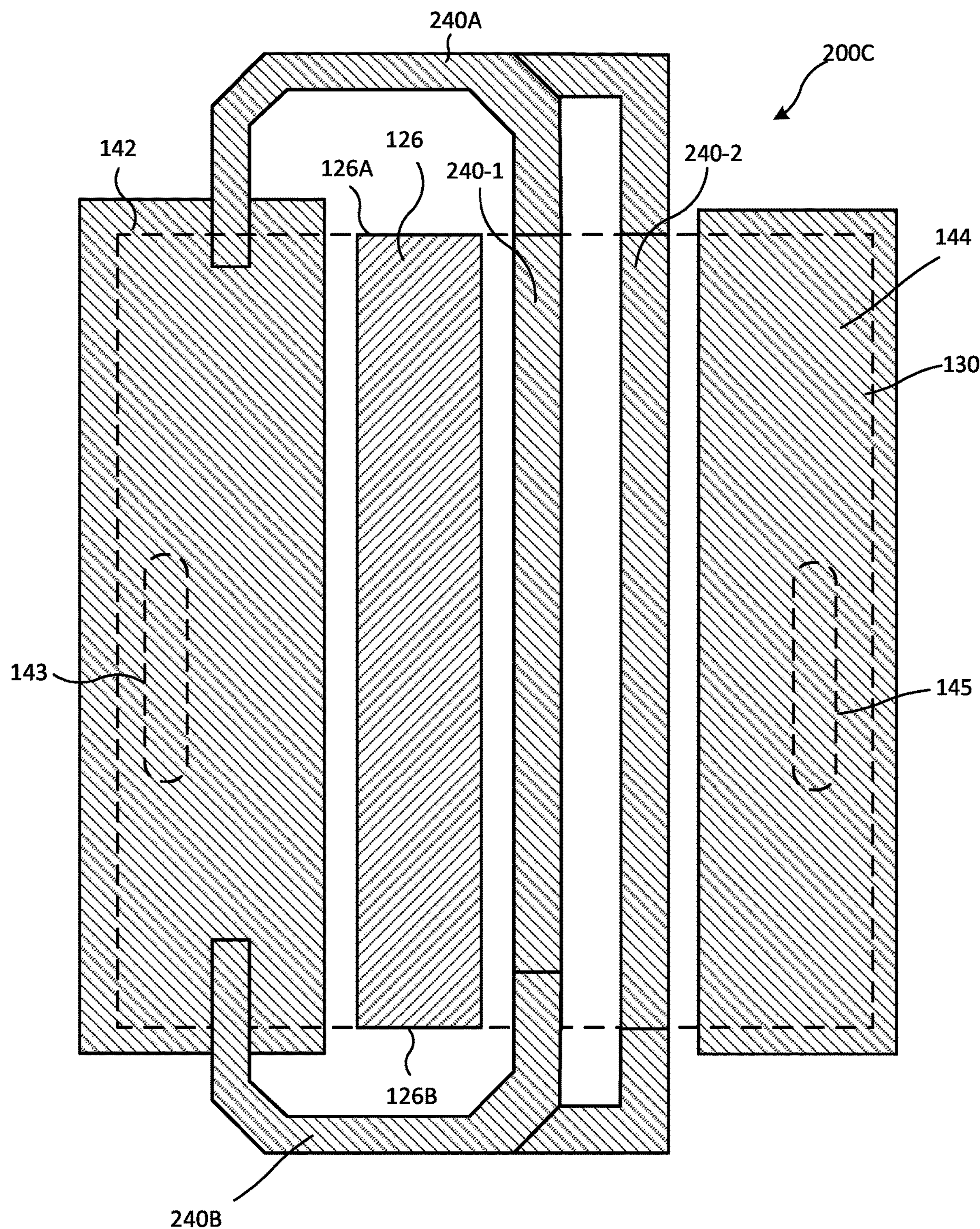

FIG. 5A is a schematic cross-sectional view of a transistor device 200 according to further embodiments, and FIGS. 5B and 5C are a schematic plan views of the transistor device 200 of FIG. 5A according to various embodiments. In particular, the transistor device 200 includes multiple source-connected field plates, namely, a first field plate 240-1 and a second field plate 240-2.

Referring to FIG. 5B, in some embodiments, both the first field plate 240-1 and the second field plate 240-2 are connected to the source metallization 142 by a field plate extension 240A that extends in a loop outside the active region 130 of the device 200 and a strap connection 235 that extends across the gate 126 within the active region 130 of the device 200. Either or both of the first field plate 240-1 and the second field plate 240-2 may be connected to the strap connection 235 by means of a conductive via (not shown) through one or more insulating layers.

FIG. 5C illustrates a device 200C according to further embodiments. Referring to FIG. 5C, in some embodiments, both the first field plate 240-1 and the second field plate 240-2 are connected to the source metallization 142 by first field plate extension 240A that extends in a loop outside the active region 130 of the device 200C on one end 126A of the gate 126 and a second field plate extension 240B that extends in a loop outside the active region 130 of the device 200C on an opposite end 126B of the gate 126.

Figure 5D:
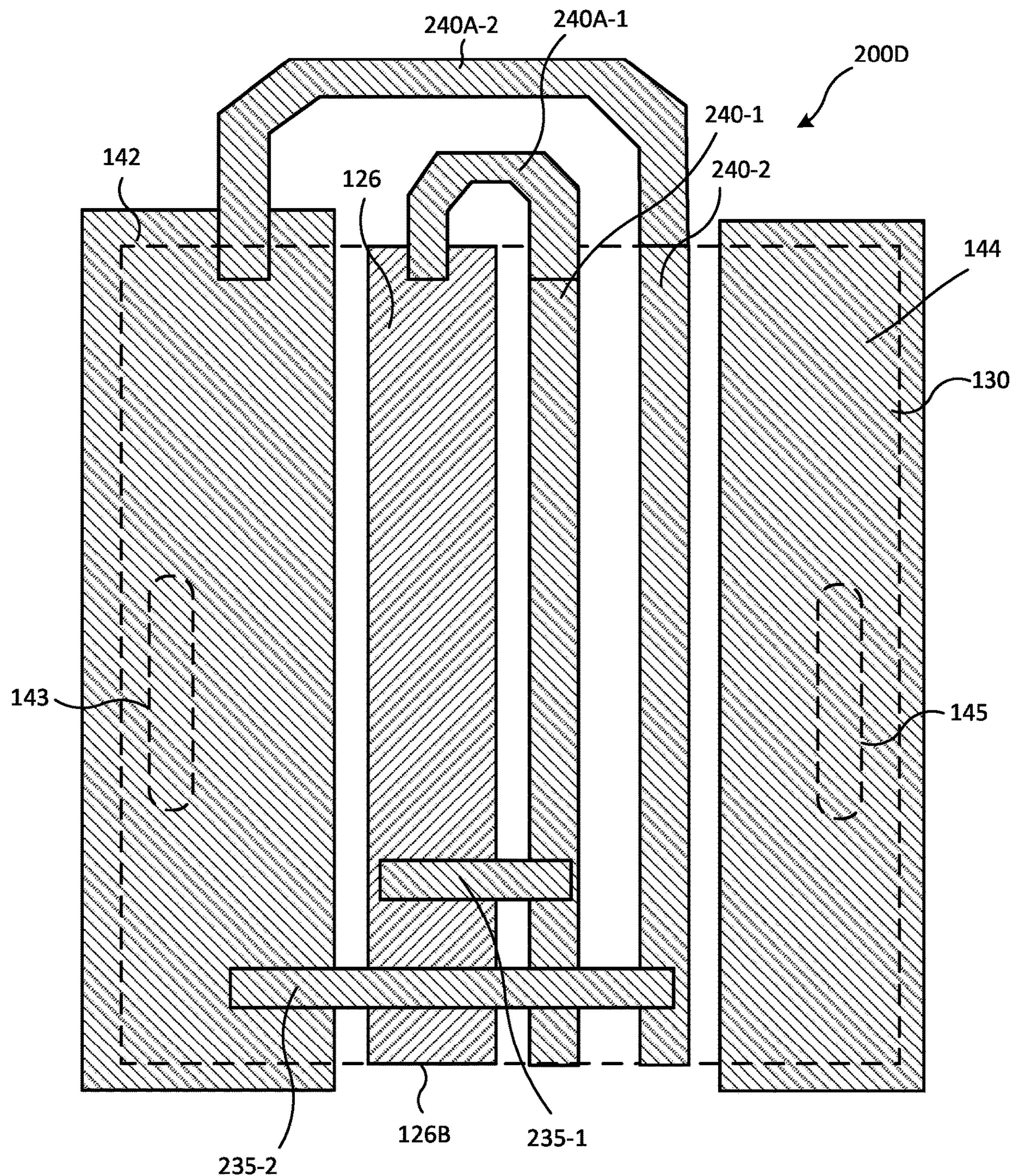

In some embodiments, one or both of the field plates 240-1, 240-2 may be connected to the gate 126 instead of the source metallization 142. For example, referring to FIG. 5D, in some embodiments, in a device 200D, the first field plate 240-1 may be connected to the gate 126 by a field plate extension 240A-1 that extends in a first loop outside the active region 130 of the device 200D and by a strap connection 235-1 within the active region 130 of the device 200D. The second field plate 240-2 is connected to the source metallization 142 by a field plate extension 240A-2 that extends in a second loop outside the first field plate extension 240A-1 and a strap connection 235-2 that extends across the first field plate 240-1 and the gate 126 within the active region 130 of the device 200D.

The strap connection 235-1 may be connected to the first field plate 240-1 and/or the gate 126 by means of a conductive via (not shown) through one or more insulating layers. Similarly, the strap connection 235-2 may be connected to the second field plate 240-2 and/or the source metallization 142 by means of a conductive via (not shown) through one or more insulating layers.

Figure 5E:
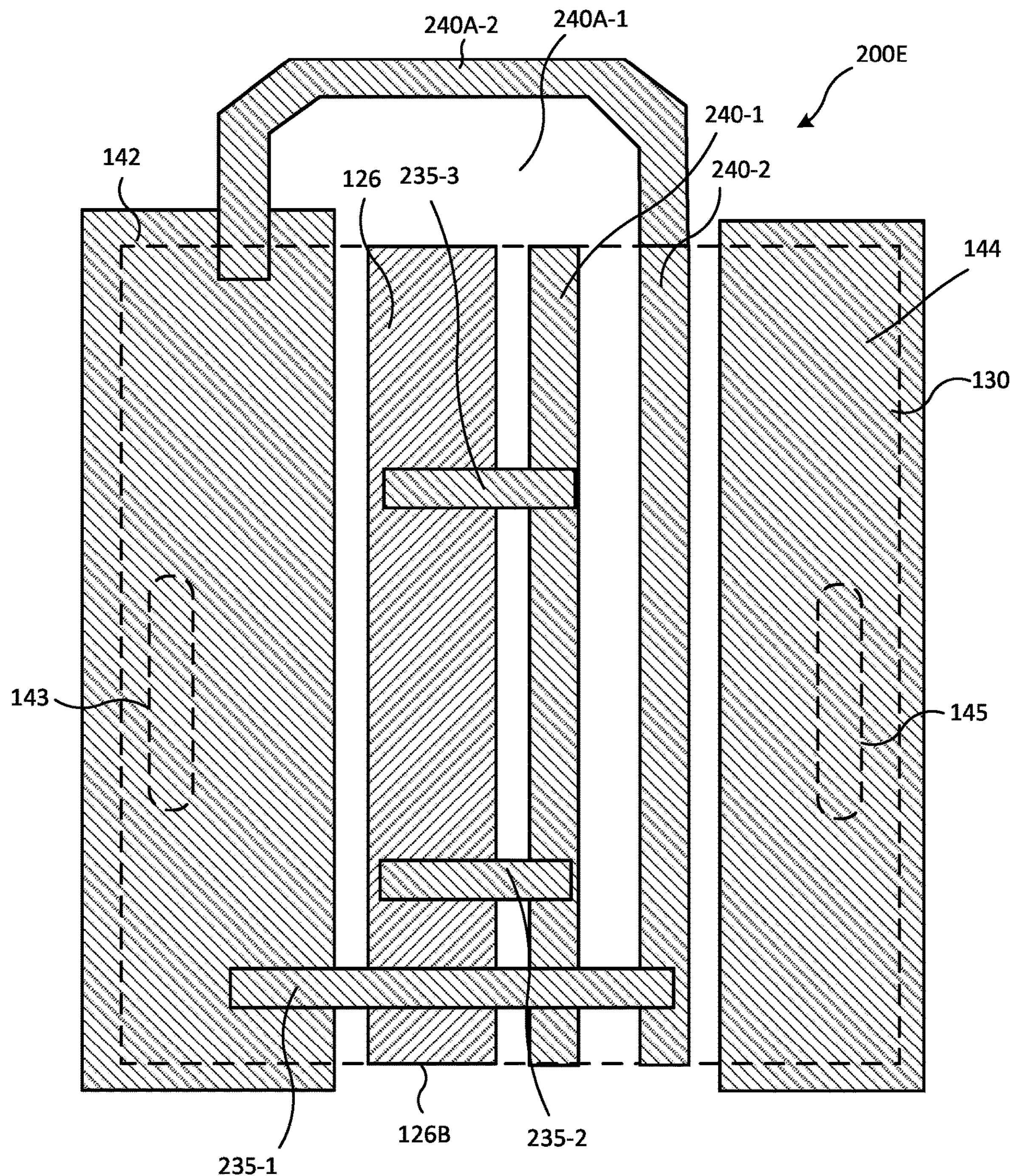

FIG. 5E illustrates a device 200E according to further embodiments. Referring to FIG. 5E, in some embodiments, the first field plate 240-1 may be connected to the gate 126 by a field plate extension 240A-1 that extends in a first loop outside the active region 130 of the device 200 and by a strap connection 235-1 within the active region 130 of the device 200E. The second field plate 240-2 is connected to the source metallization 142 by a first strap connection 235-2 and a second strap connection 235-3 that extend across the first field plate 240-1 and the gate 126 within the active region 130 of the device 200E.

Although the gate 126 and the field plates 240-1, 240-2 are illustrated in FIGS. 5A to 5E as being laterally spaced apart, it will be appreciated that in some embodiments, the second field plate 240-2 may overlap the first field plate 240-1, and/or the first field plate 240-1 may overlap the gate 126 in the lateral direction, with the metallization layers being separated by a dielectric layer in the area of overlap.

The strap connection 235-1 may be connected to the second field plate 240-2 and/or the gate 126 by means of a conductive via (not shown) through one or more insulating layers. Similarly, the strap connections 235-2, 235-3 may be connected to the first field plate 240-1 and/or the gate 126 by means of conductive vias (not shown) through one or more insulating layers.

Figure 5F:
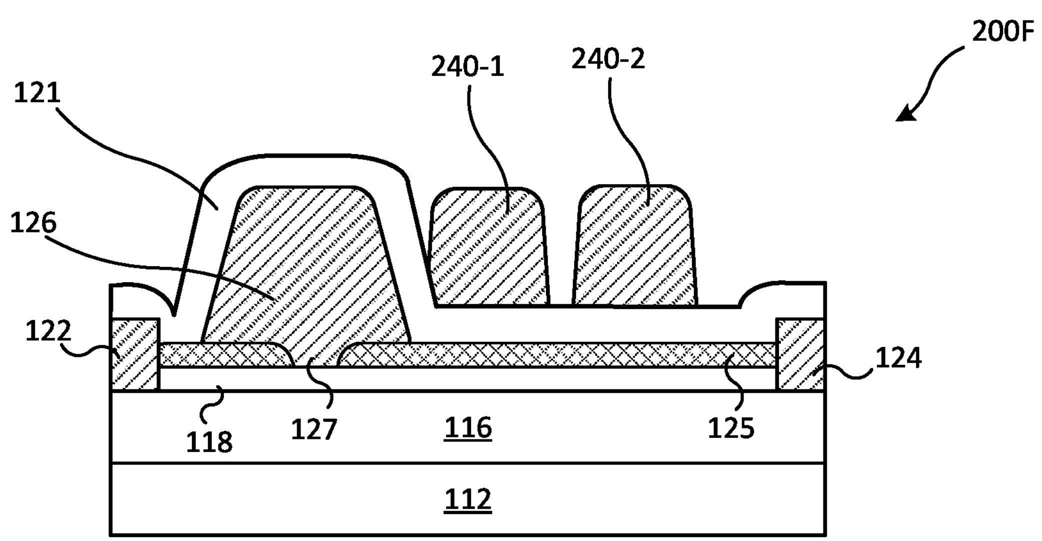
FIGS. 5F, 5G and 5H are schematic cross-sectional views of transistor devices according to further embodiments.

FIG. 5F illustrates a device 200F according to further embodiments. FIG. 5F illustrates a HEMT device 200F that is similar to the HEMT device 200 shown in FIG. 5A (with like reference signs referring to like elements), except that in the device 200F, neither the first field plate 240-1 nor the second field plate 240-2 is recessed. That is, neither the first field plate 240-1 nor the second field plate 240-2 includes a recessed portion 143 as shown in FIG. SA. Both the first field plate 240-1 and the second field plate 240-2 are formed on the interlayer dielectric layer 121.

Figure 5G:
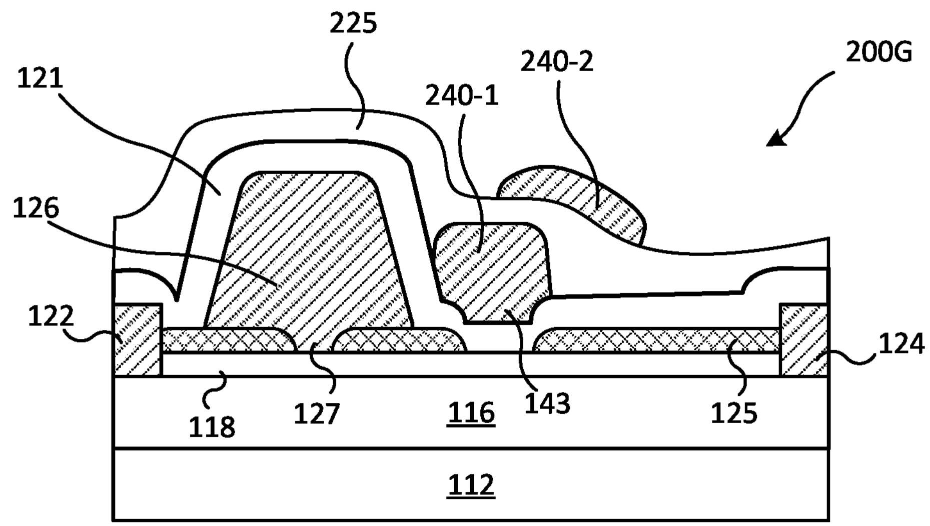

FIG. 5G illustrates a HEMT device 200G that is similar to the HEMT device 200 shown in FIG. 5A (with like reference signs referring to like elements), except that in the device 200G, a second interlayer dielectric layer 225 (which may include SiN, $SiO_x$, SiON, etc.) is formed on the first field plate 240-1 and the interlayer dielectric layer 121, and the second field plate 240-2 is formed on the second interlayer dielectric layer 225. In the embodiment illustrated in FIG. 5F, the second field plate 240-2 overlaps the first field plate 240-1 in the vertical direction.

Figure 5H:
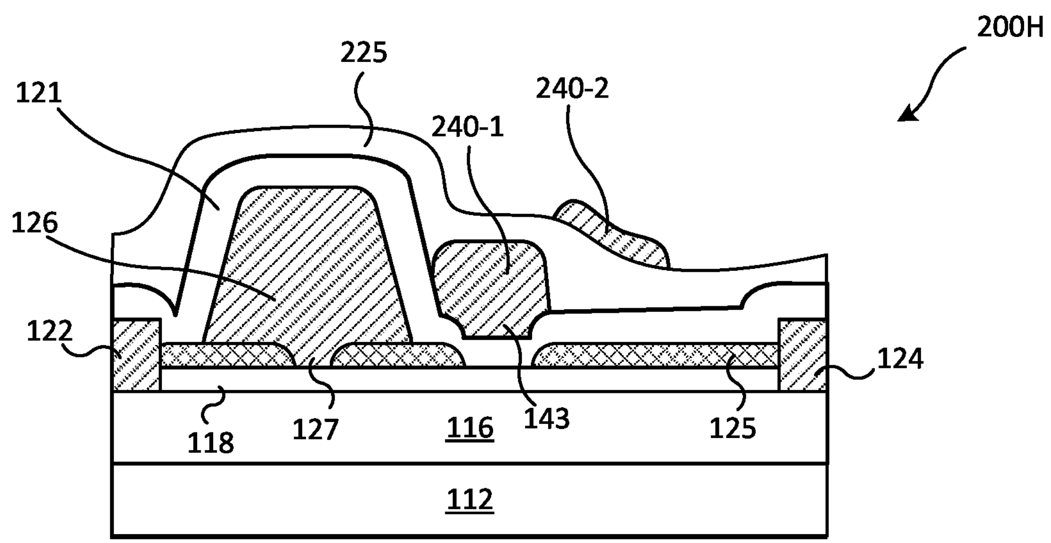

FIG. 5H illustrates a HEMT device 200H that is similar to the HEMT device 200 shown in FIG. 5G (with like reference signs referring to like elements), except that in the device 200H, the second field plate 240-2 is laterally spaced apart from the first field plate 240-1 (i.e., the second field plate 240-2 does not overlap the first field plate 240-1 in the vertical direction).

It will be appreciated that the modifications shown in FIGS. 5F to 5H (and others) may be made alone or together to the device shown in FIG. 5A.

In any of the device structures illustrated in FIGS. 5A or 5F to 5H, either or both of the field plates 240-1, 240-2 may be connected to the source metallization 142 and/or the gate 126 by one or more field plate extensions 240A, 240B that extend outside the active region 130 of the device and/or one or more strap connections 235 that extend across the gate 126 within the active region 130 of the device. In some embodiments, only one of the field plates 240-1, 240-2 may be connected to the source metallization 142 and/or the gate 126 by a field plate extension that extends outside the active region 130 of the device while the other field plate may be connected to the source metallization 142, the gate 126 and/or the other field plate by one or more strap connections 235 that extend across the gate 126 within the active region 130 of the device.

Although two field plates are illustrated in the embodiments illustrated in FIGS. 5A to 5H, it will be appreciated that additional field plates may be provided, and that such additional field plates may include connections to the source contact 122 by means of one or more loop connections that extend outside the active region of the device and/or one or more strap connections that extend across the active region of the device. Such additional field plates may be separated from the gate 126 and/or the field plates 240-1, 240-2 by one or more additional dielectric layers.

FIGS. 6A to 6H are cross-sectional views illustrating operations for manufacturing a transistor device including a field plate in accordance with some embodiments.

Figure 6A:
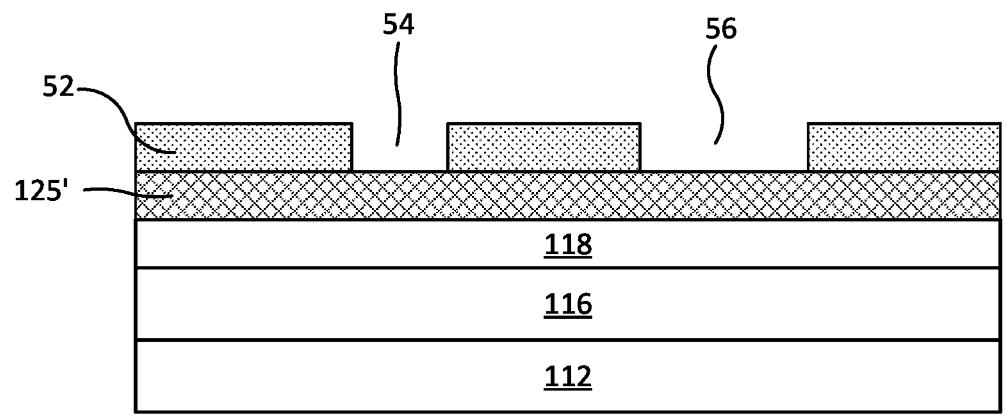
FIGS. 6A to 6H are schematic cross-sectional views illustrating operations for manufacturing a transistor device including a field plate in accordance with some embodiments.

Referring to FIG. 6A, a substrate 112 is provided on which a channel layer 116 and a barrier layer 118 are formed. A preliminary surface dielectric layer 125' is formed on the barrier layer 118. A layer of photoresist 52 is formed on the preliminary surface dielectric layer 125' and patterned to form two openings 54, 56 therein.

Figure 6B:
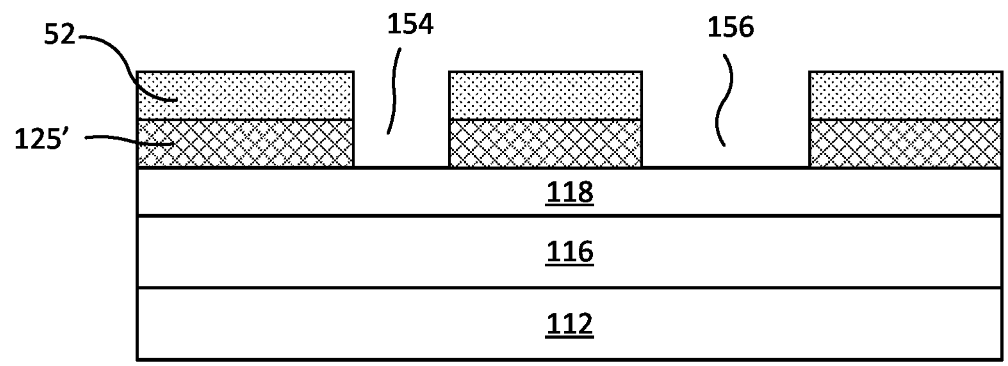

Referring to FIG. 6B, the preliminary surface dielectric layer 125' is selectively etched through the two openings 54, 56, for example using a reactive ion etch or inductively coupled plasma, to form two corresponding openings 154, 156 therein.

Figure 6C:
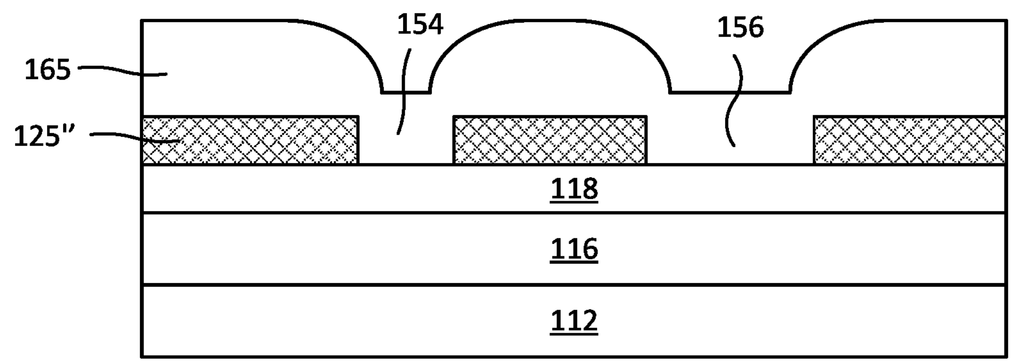

Referring to FIG. 6C, a sacrificial dielectric layer 165 is blanket deposited over the preliminary surface dielectric layer 125' to fill the openings 154, 156. The sacrificial dielectric layer 165 may be formed of the same material as the preliminary surface dielectric layer 125'. For example, both the sacrificial dielectric layer 165 and the preliminary surface dielectric layer 125' may be formed of silicon nitride.

Figure 6D:
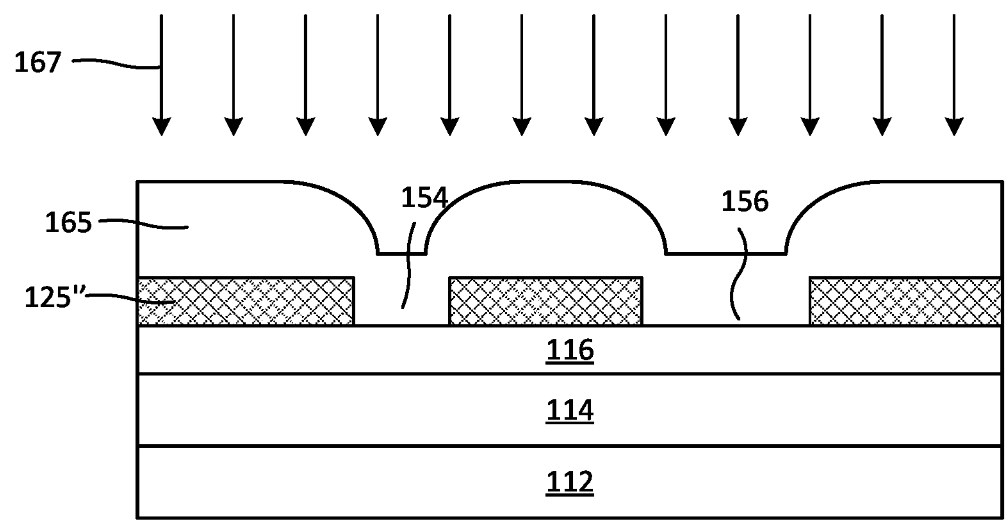
Figure 6E:
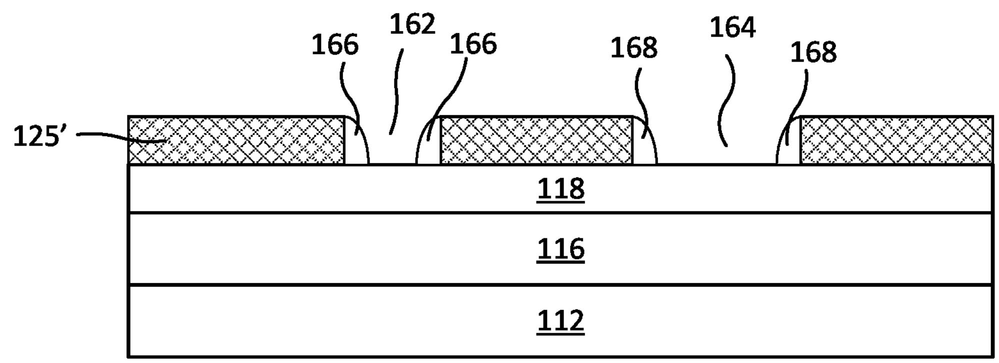

Referring to FIG. 6D, the sacrificial dielectric layer 165 is anisotropically etched, for example using a reactive ion etch or inductively coupled plasma 167, to remove portions of the sacrificial dielectric layer 165 except for side portions 166 on the inner surfaces of the opening 154 of the preliminary surface dielectric layer 125' and side portions 168 on the inner surfaces of the opening 156 of the preliminary surface dielectric layer 125' to form a gate aperture 162 and a field plate aperture 164 having rounded or beveled edges, as shown in FIG. 6E. The preliminary surface dielectric layer 125' along with the side portions 166, 168 together form a surface dielectric layer 125 on the barrier layer 118. With the side portions 166 present, the width of the gate aperture 162 may be about 250 nm.

Figure 6F:
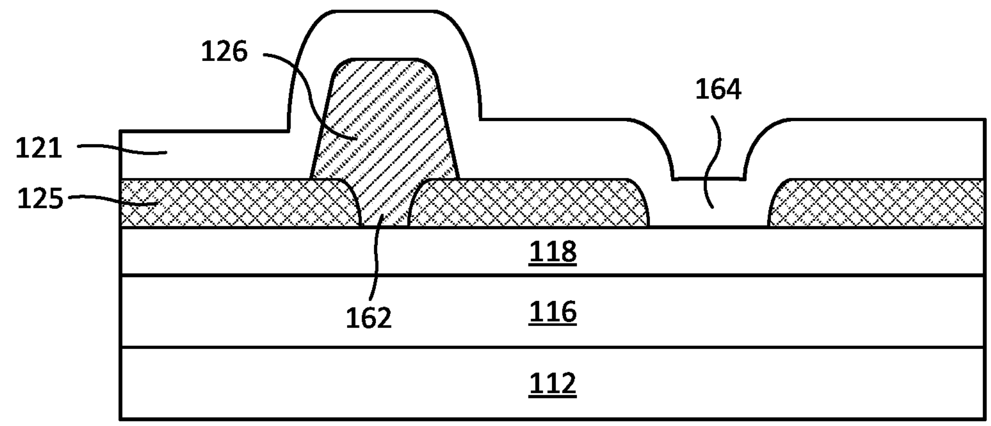

Referring to FIG. 6F, a metal, such as gold, is deposited and patterned to form a mushroom or T-top gate 126 on the surface dielectric layer 125. A recessed contact portion of the gate 126 extends through the gate aperture 162 to contact the barrier layer 118. An interlayer dielectric layer 121 is then blanket deposited over the surface dielectric layer 125 and the gate 126. The interlayer dielectric layer 121 extends through the field plate aperture 164 to contact the barrier layer 118.

Figure 6G:
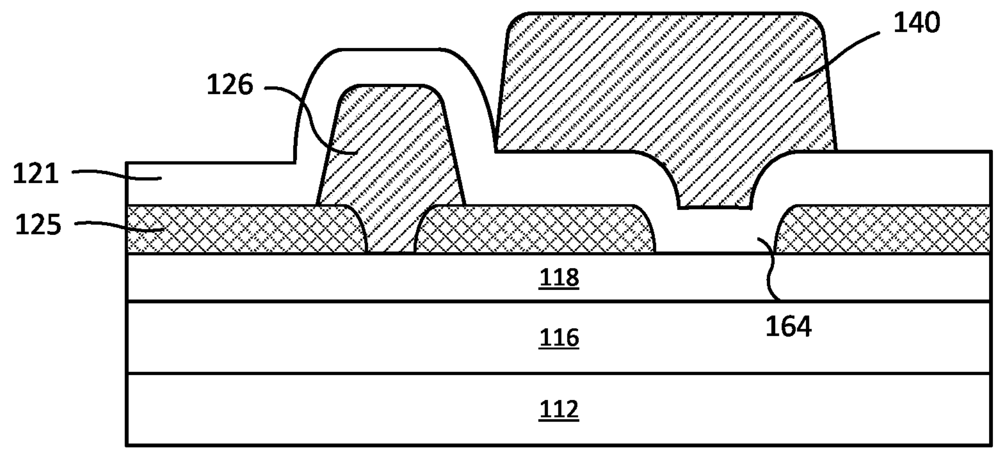

Referring to FIG. 6G, a metal, such as gold, is then deposited on the interlayer dielectric layer 121 above the field plate aperture 164 and patterned to form a field plate 140. The field plate 140 may self-aligned to the gate 126 by the operations described above.

Figure 6H:
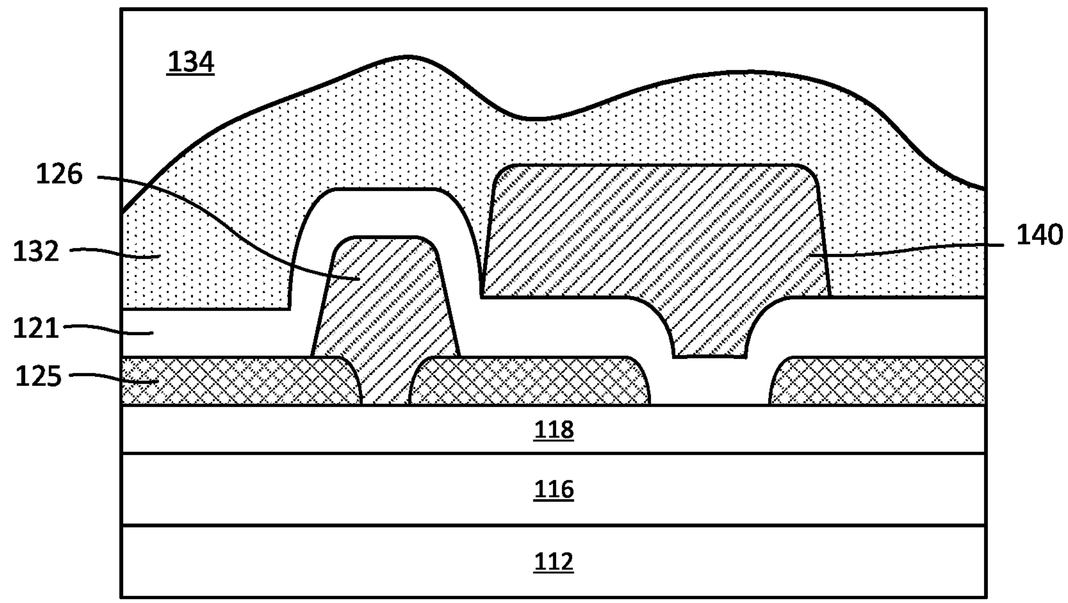

Referring to FIG. 6H, a passivation layer 132, such as a layer of SiON, is formed over the field plate 140 and the interlayer dielectric layer 121. Finally, a field dielectric layer 134, such as silicon nitride, is formed over the passivation layer 132.

Figure 7:
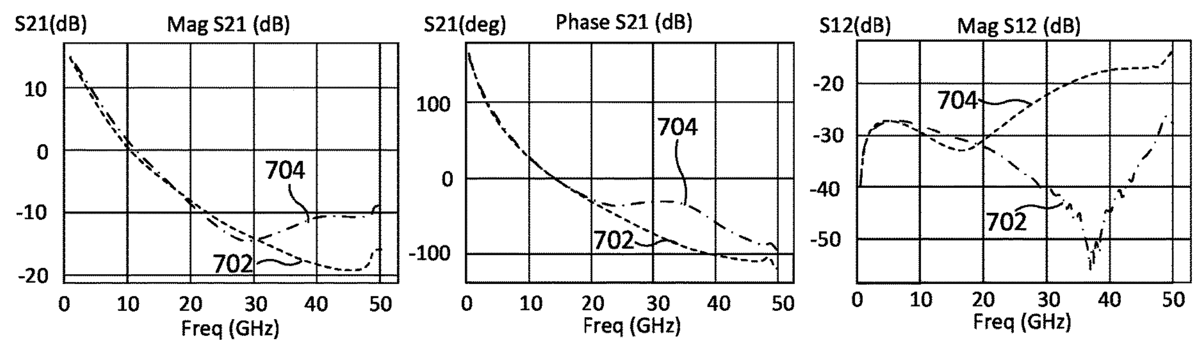
FIGS. 7 and 8 illustrate simulated S21 and S12 parameters for devices having a loop connection outside the active region between the field plate and source and with and without a second (strap) connection.
Figure 8:
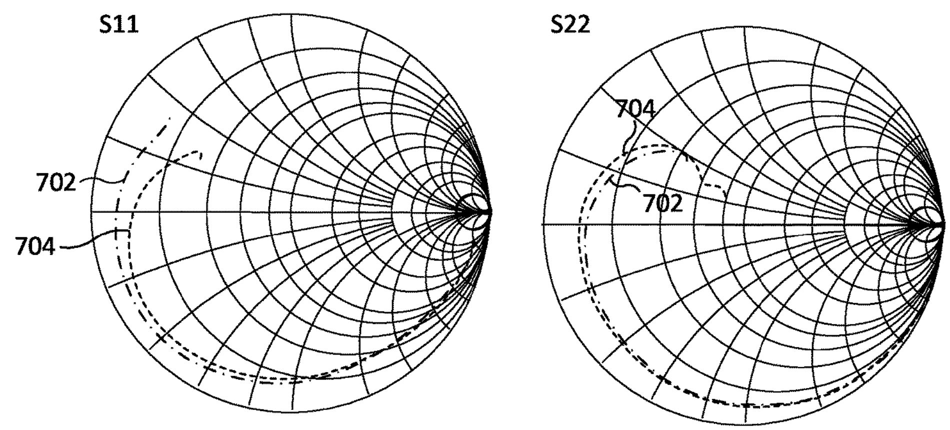

FIGS. 7 and 8 illustrates simulated S21 (phase and magnitude) and S12 (magnitude) parameters for devices having a loop connection outside the active region between the field plate and source and with (curves 702) and without (curves 704) a second (strap) connection. These curves illustrate that when the second connection is omitted, the device performance is altered.

Figure 9:
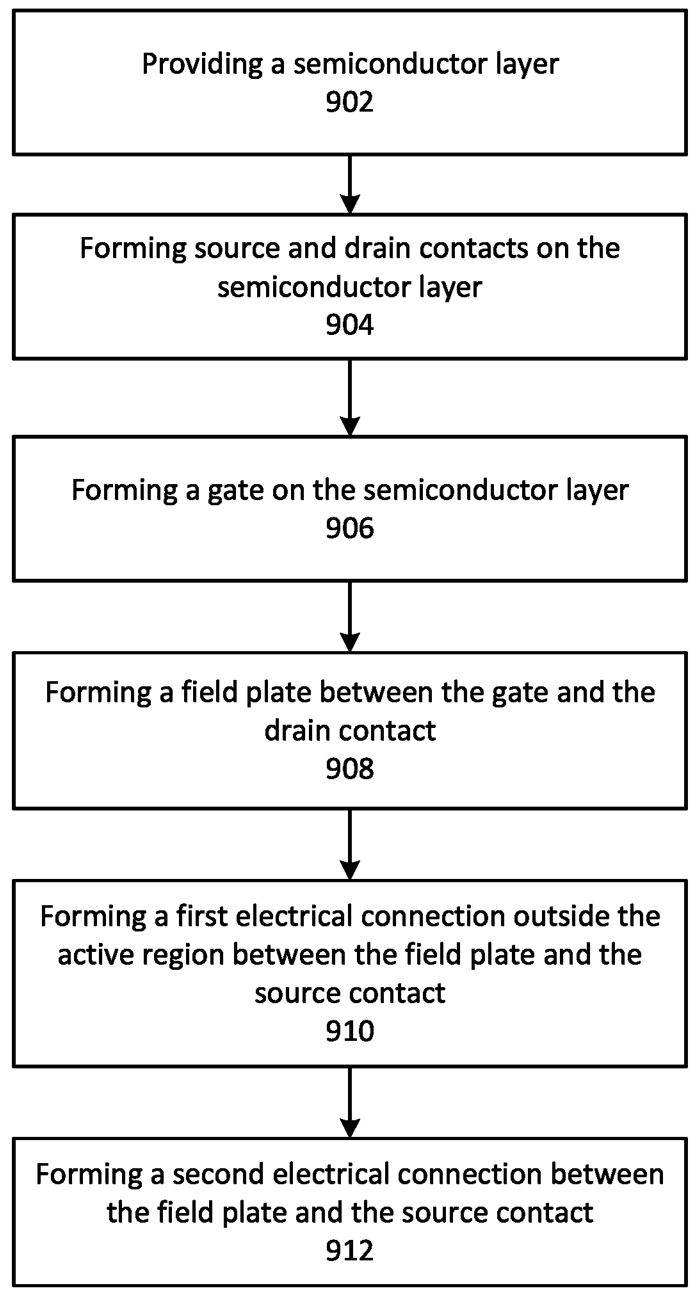
FIG. 9 is a block diagram illustrating operations of forming a transistor device according to some embodiments.

FIG. 9 is a block diagram illustrating operations of forming a transistor device according to some embodiments. Referring to FIG. 9 and FIGS. 6A to 6H, a method of forming a transistor device according to some embodiments includes providing a semiconductor layer (block 902), forming source and drain contacts on the semiconductor layer (block 904), forming a gate contact on the semiconductor layer between the source and drain contacts (block 906), and forming a field plate over the semiconductor layer between the gate contact and the drain contact (block 908).

The method further includes forming a first electrical connection between the field plate and the source contact, wherein the first electrical connection is outside an active region of the transistor device (block 910), and forming a second electrical connection between the field plate and the source contact (block 912).

The transistor device may include a source metallization in electrical contact with the source contact, and the first electrical connection may include a field plate extension that extends outside the active region of the device in a loop to contact the source metallization.

In some embodiments, the transistor device includes a source metallization in electrical contact with the source contact, and the second electrical connection includes a strap that extends from the field plate over the gate to the source metallization.

In some embodiments, the second electrical connection may be located between 0 and 500 microns from an end of the gate opposite the first electrical connection. The second electrical connection may be located between 10 and 50 microns from the end of the gate opposite the first electrical connection, and in some embodiments, the second electrical connection may be located about 20 microns from the end of the gate opposite the first electrical connection.

The second electrical connection may be formed outside the active region of the device and may not cross over the gate.

In some embodiments, the transistor device may include a source metallization in electrical contact with the source contact, and the second connection may include a field plate extension that extends outside the active region of the device in a loop to contact the source metallization. The first electrical connection and the second electrical connection may be formed as part of a source metallization process.

Transistor devices as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 10A-10C.

Figure 10A:
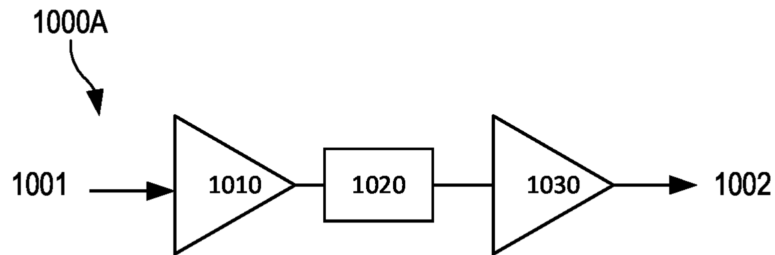
FIGS. 10A-10C are schematic block diagrams of multi-amplifier circuits in which RF transistor amplifiers incorporating transistor devices according to embodiments may be used.

Referring to FIG. 10A, an RF transistor amplifier 1000A is schematically illustrated that includes a pre-amplifier 1010 and a main amplifier 1030 that are electrically connected in series. As shown in FIG. 10A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 10A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 10B:
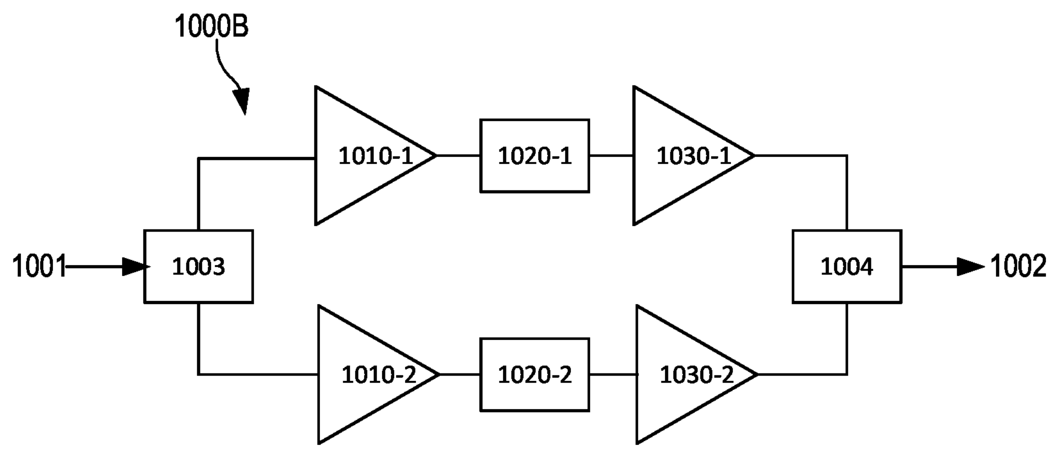

Referring to FIG. 10B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 10C:
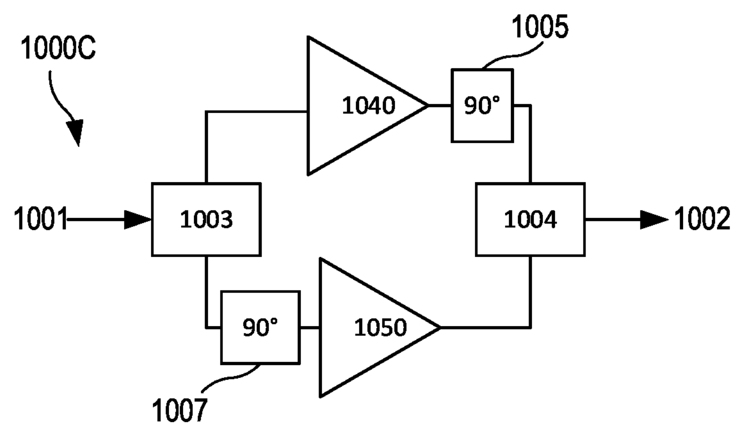

As shown in FIG. 10C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 10C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat.

Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Figure 11:
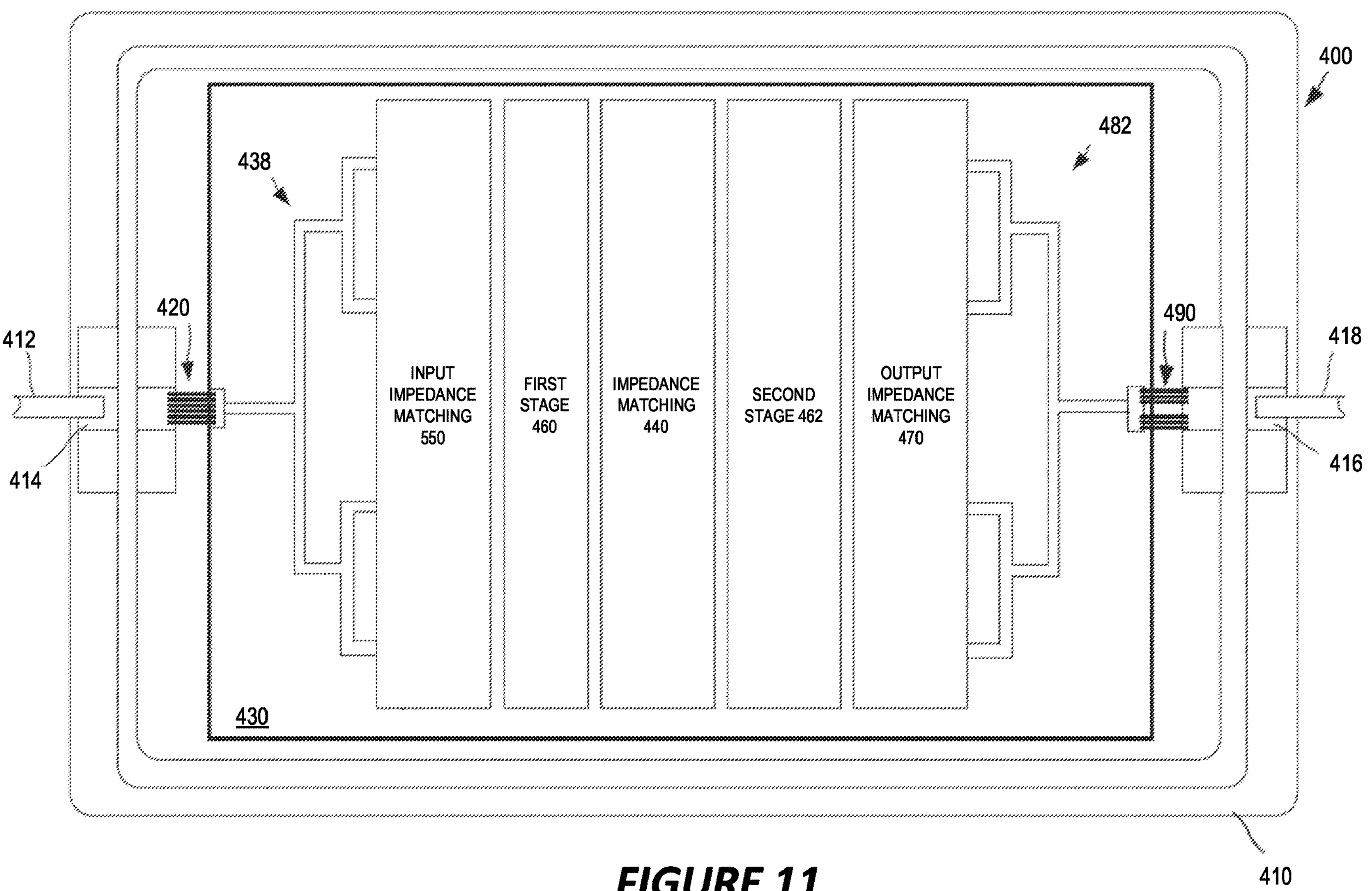
FIG. 11 is a schematic plan view of a monolithic microwave integrated circuit RF transistor amplifier according to some embodiments.

FIG. 11 is a plan view of a MMIC RF transistor amplifier 400 according to embodiments of the present inventive concepts. As shown in FIG. 11, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

The RF transistor amplifiers according to embodiments of the present inventive concepts may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present inventive concepts may be particularly advantageous for RF transistor amplifiers that operate at frequencies of 10 GHz and higher.

Figure 12A:
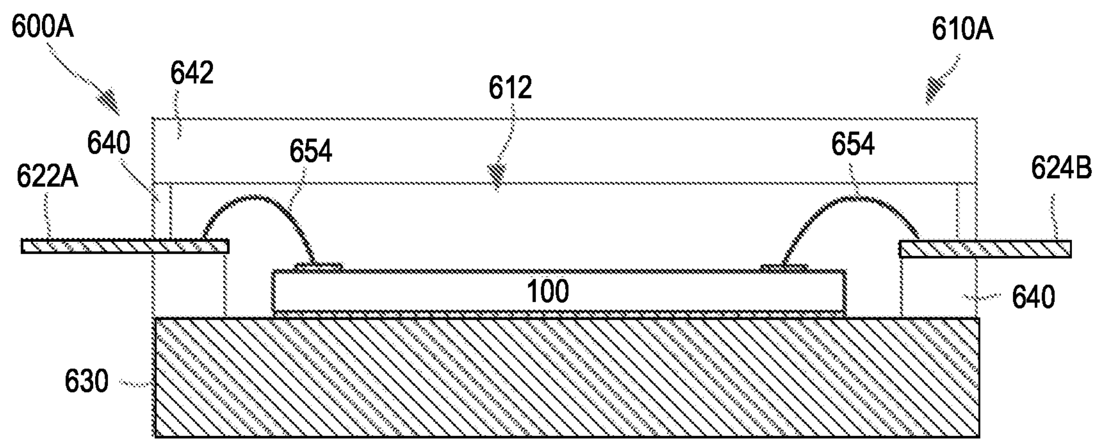
FIGS. 12A and 12B are schematic cross-sectional views illustrating two example ways that an RF transistor device according to some embodiments may be packaged to provide RF transistor amplifiers.
Figure 12B:
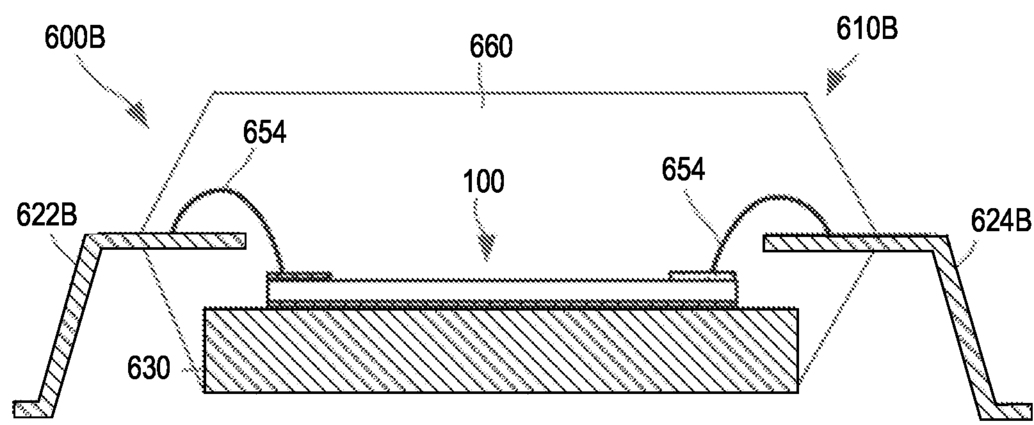

FIGS. 12A and 12B are schematic cross-sectional views illustrating several example transistor amplifier packages including RF transistor amplifier devices according to embodiments of the present inventive concepts.

FIG. 12A is a schematic side view of a packaged Group III nitride-based RF transistor amplifier 600A. As shown in FIG. 12A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, $Al_2O_3$. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the semiconductor layer structure 150, while the source terminal is on the bottom side of the semiconductor layer structure 150.

The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 136 and may also serve as a heat dissipation structure that dissipates heat that is generated in the RF transistor amplifier die 100.

The heat is primarily generated in the upper portion of the RF transistor amplifier die 100 where relatively high current densities are generated in, for example, the channel regions of the unit cell transistors 102. This heat may be transferred though the source vias 146 and the semiconductor layer structure 150 to the source terminal and then to the metal submount 630.

FIG. 12B is a schematic side view of another packaged Group III nitride based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630.

Other components of RF transistor amplifier 600B may be the same as the like-numbered components of RF transistor amplifier 600A and hence further description thereof will be omitted. While embodiments of the present inventive concepts are described above with respect to gallium nitride based RF transistor amplifiers, it will be appreciated that embodiments of the inventive concepts are not limited thereto. For example, the transistors described above may also be used as power transistors in switching and other applications.

Embodiments of the present inventive concepts have been described above with reference to the accompanying drawings, in which embodiments of the inventive concepts are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout. In the specification and the figures, two-part reference numbers (i.e., two numbers separated by a dash, such as 100-1) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term “and/or” includes any and all combinations of one or more of the associated listed items. The terminology used herein is for the purpose of describing particular embodiments only and is not intended to be limiting of the inventive concepts. As used herein, the terms “comprises,” “comprising,” “includes” and/or “including” specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being “on” or extending “onto” another element, it can be directly on or extend directly onto the other element or intervening elements may also be present. In contrast, when an element is referred to as being “directly on” or extending “directly onto” another element, there are no intervening elements present. It will also be understood that when an element is referred to as being “connected” or “coupled” to another element, it can be directly connected or coupled to the other element or intervening elements may be present. In contrast, when an element is referred to as being “directly connected” or “directly coupled” to another element, there are no intervening elements present. Relative terms such as “below” or “above” or “upper” or “lower” or “horizontal” or “lateral” or “vertical” may be used herein to describe a relationship of one element, layer or region to another element, layer or region as illustrated in the figures.

Transistor structures with features that may be used in embodiments of the present inventive concepts are disclosed in the following commonly assigned publications, the contents of each of which are fully incorporated by reference herein in their entirety: U.S. Pat. No. 6,849,882 to Chavarkar et al. and entitled “Group-III Nitride Based High Electron Mobility Transistor (HEMT) With Barrier/Spacer Layer”; U.S. Pat. No. 7,230,284 to Parikh et al. and entitled “Insulating Gate AlGaN/GaN HEMT”; U.S. Pat. No. 7,501,669 to Parikh et al. and entitled “Wide Bandgap Transistor Devices With Field Plates”; U.S. Pat. No. 7,126,426 to Mishra et al. and entitled “Cascode Amplifier Structures Including Wide Bandgap Field Effect Transistor With Field Plates”; U.S. Pat. No. 7,550,783 to Wu et al. and entitled “Wide Bandgap HEMTs With Source Connected Field Plates”; U.S. Pat. No. 7,573,078 to Wu et al. and entitled “Wide Bandgap Transistors With Multiple Field Plates”; U.S. Pat. Pub. No. 2005/0253167 to Wu et al. and entitled “Wide Bandgap Field Effect Transistors With Source Connected Field Plates”; U.S. Pat. Pub. No. 2006/0202272 to Wu et al. and entitled “Wide Bandgap Transistors With Gate-Source Field Plates”; U.S. Pat. Pub. No. 2008/0128752 to Wu and entitled “GaN Based HEMTs With Buried Field Plates”; U.S. Pat. Pub. No. 2010/0276698 to Moore et al. and entitled “Gate Electrodes For Millimeter-Wave Operation and Methods of Fabrication; U.S. Pat. Pub. No. 2012/0049973 to Smith, Jr. et al. and entitled “High Power Gallium Nitride Field Effect Transistor Switches”; U.S. Pat. Pub. No. 2012/0194276 to Fisher and entitled “Low Noise Amplifiers Including Group III Nitride Based High Electron Mobility Transistors”; and U.S. Pat. No. 9,847,411 to Sriram et al. entitled “Recessed field plate transistor structures.”

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the inventive concepts should not be limited to the specific embodiments described above.

What is claimed is:

1. A transistor device, comprising:
- a semiconductor layer;
- source and drain contacts on the semiconductor layer;
- a gate contact on the semiconductor layer between the source and drain contacts;
- a field plate over the semiconductor layer between the gate contact and the drain contact;
- a source metallization in electrical contact with the source contact by a conductive via;
- a first electrical connection between the field plate and the source metallization, wherein the first electrical connection is outside an active region of the transistor device; and
- a second electrical connection between the field plate and the source metallization.

2. The transistor device of claim 1, wherein the first electrical connection between the field plate and the source metallization does not cross over the gate contact.

3. The transistor device of claim 2, wherein the first electrical connection comprises a field plate extension that extends outside the active region of the device in a loop to contact the source metallization.

4. The transistor device of claim 1, wherein the second electrical connection comprises a strap that extends from the field plate over the gate to the source metallization.

5. The transistor device of claim 4, wherein the second electrical connection is located between 0 and 500 microns from an end of the gate opposite the first electrical connection.

6. The transistor device of claim 4, wherein the second electrical connection is located between 10 and 50 microns from the end of the gate opposite the first electrical connection.

7. The transistor device of claim 4, wherein the second electrical connection is located about 20 microns from the end of the gate opposite the first electrical connection.

8. The transistor device of claim 1, wherein the second electrical connection is formed outside the active region of the device and does not cross over the gate.

9. The transistor device of claim 8, wherein the transistor device comprises a source metallization in electrical contact with the source contact, and wherein the second connection comprises a field plate extension that extends outside the active region of the device in a loop to contact the source metallization.

10. The transistor device of claim 1, wherein the first electrical connection and the second electrical connection are formed as part of a source metallization process.

11. The transistor device of claim 1, wherein the second electrical connection between the field plate and the source contact comprises a plurality of straps that extend from the field plate over the gate to the source metallization within the active region of the transistor device.

12. The transistor device of claim 1, wherein the field plate comprises a first field plate, the transistor device further comprising:

a second field plate over the semiconductor layer between the gate contact and the drain contact;

a third electrical connection between the second field plate and the source contact, wherein the third electrical connection is outside an active region of the transistor device; and a fourth electrical connection between the second field plate and the source contact.

13. The transistor device of claim 12, wherein the third electrical connection between the second field plate and the source contact does not cross over the gate contact.

14. The transistor device of claim 13, wherein the transistor device comprises a source metallization in electrical contact with the source contact, and wherein the third electrical connection comprises a field plate extension that extends outside the active region of the device in a loop to contact the source metallization.

15. The transistor device of claim 12, wherein the transistor device comprises a source metallization in electrical contact with the source contact, and wherein the fourth electrical connection comprises a strap that extends from the second field plate over the gate to the source metallization.

16. The transistor device of claim 1, wherein the field plate comprises a first field plate, the transistor device further comprising:

a second field plate over the semiconductor layer between the gate contact and the drain contact; and a third electrical connection between the second field plate and the source contact, wherein the third electrical connection is within an active region of the transistor device.

17. The transistor device of claim 16, wherein the first field plate is between the second field plate and the source contact.

18. A method of forming a transistor device, comprising:

providing a semiconductor layer;

forming source and drain contacts on the semiconductor layer;

forming a gate contact on the semiconductor layer between the source and drain contacts;

forming a field plate over the semiconductor layer between the gate contact and the drain contact;

forming a source metallization in electrical contact with the source contact by a conductive via;

forming a first electrical connection between the field plate and the source metallization, wherein the first electrical connection is outside an active region of the transistor device; and forming a second electrical connection between the field plate and the source metallization.

19. The method of claim 18, wherein the first electrical connection between the field plate and the source metallization does not cross over the gate contact.

20. The method of claim 19, wherein the first electrical connection comprises a field plate extension that extends outside the active region of the device in a loop to contact the source metallization.

21. The method of claim 18, wherein the second electrical connection comprises a strap that extends from the field plate over the gate to the source metallization.

22. The method of claim 21, wherein the second electrical connection is located between 0 and 500 microns from an end of the gate opposite the first electrical connection.

23. The method of claim 21, wherein the second electrical connection is located between 10 and 50 microns from the end of the gate opposite the first electrical connection.

24. The method of claim 21, wherein the second electrical connection is located about 20 microns from the end of the gate opposite the first electrical connection.

25. The method of claim 18, wherein the second electrical connection is formed outside the active region of the device and does not cross over the gate.

26. The method of claim 25, wherein the transistor device comprises a source metallization in electrical contact with the source contact, and wherein the second connection comprises a field plate extension that extends outside the active region of the device in a loop to contact the source metallization.

27. The method device of claim 18, wherein the first electrical connection and the second electrical connection are formed as part of a source metallization process.

28. The method of claim 18, wherein the second electrical connection between the field plate and the source contact comprises a plurality of straps that extend from the field plate over the gate to the source metallization within the active region of the transistor device.

29. The method of claim 18, wherein the field plate comprises a first field plate, the transistor device further comprising:

a second field plate over the semiconductor layer between the gate contact and the drain contact;

a third electrical connection between the second field plate and the source contact, wherein the third electrical connection is outside an active region of the transistor device; and a fourth electrical connection between the second field plate and the source contact.

30. The method of claim 29, wherein the third electrical connection between the second field plate and the source contact does not cross over the gate contact.

31. The method of claim 30, wherein the transistor device comprises a source metallization in electrical contact with the source contact, and wherein the third electrical connection comprises a field plate extension that extends outside the active region of the device in a loop to contact the source metallization.

32. The method of claim 29, wherein the transistor device comprises a source metallization in electrical contact with the source contact, and wherein the fourth electrical connection comprises a strap that extends from the second field plate over the gate to the source metallization.

33. A transistor device, comprising:

a semiconductor layer;

source and drain contacts on the semiconductor layer;

a gate contact on the semiconductor layer between the source and drain contacts;

a field plate over the semiconductor layer between the gate contact and the drain contact;

a source metallization in electrical contact with the source contact by a conductive via;

a first electrical connection between the field plate and the source metallization, wherein the first electrical connection is outside an active region of the transistor device; and a second electrical connection between the field plate and the source metallization that is within the active region of the device.

* * * * *